(12) United States Patent
Chen et al.

(10) Patent No.: US 12,119,296 B2
(45) Date of Patent: *Oct. 15, 2024

(54) ENCIRCLING A SEMICONDUCTOR DEVICE WITH STACKED FRAMES ON A SUBSTRATE

(71) Applicant: Taiwan Semiconductor Manufacturing Company, Ltd., Hsinchu (TW)

(72) Inventors: Chien-Hung Chen, Taipei (TW); Shu-Shen Yeh, Taoyuan (TW); Yu-Sheng Lin, Hsinchu County (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,766

(22) Filed: Aug. 2, 2023

(65) Prior Publication Data

US 2023/0386991 A1     Nov. 30, 2023

Related U.S. Application Data

(63) Continuation of application No. 17/344,964, filed on Jun. 11, 2021, now Pat. No. 11,823,991.

(Continued)

(51) Int. Cl.
*H01L 23/498*     (2006.01)
*H01L 21/48*      (2006.01)
(Continued)

(52) U.S. Cl.
CPC .... *H01L 23/49838* (2013.01); *H01L 21/4846* (2013.01); *H01L 21/67346* (2013.01);
(Continued)

(58) Field of Classification Search
CPC ........... H01L 21/4846; H01L 21/67346; H01L 23/49838; H01L 23/04; H01L 23/49816;
(Continued)

(56) References Cited

U.S. PATENT DOCUMENTS 7,122,406 B1 * 10/2006 Yilmaz ................. H01L 21/568
257/E23.037
11,705,408 B2 * 7/2023 Yu ......................... H01L 23/585
257/620

(Continued)

*Primary Examiner* — Alonzo Chambliss
(74) *Attorney, Agent, or Firm* — JCIPRNET

(57) ABSTRACT

A semiconductor device includes a circuit substrate, at least one semiconductor die, a first frame, and a second frame. The at least one semiconductor die is connected to the circuit substrate. The first frame is disposed on the circuit substrate and encircles the at least one semiconductor die. The second frame is stacked on the first frame. The first frame includes a base portion and an overhang portion. The base portion has a first width. The overhang portion is disposed on the base portion and has a second width greater than the first width. The overhang portion laterally protrudes towards the at least one semiconductor die with respect to the base portion. The first width and the second width are measured in a protruding direction of the overhang portion.

20 Claims, 30 Drawing Sheets

Related U.S. Application Data

(60) Provisional application No. 63/166,253, filed on Mar. 26, 2021.

(51) Int. Cl.
  *H01L 21/673* (2006.01)
  *H01L 23/04* (2006.01)
  *H01L 23/31* (2006.01)
  *H01L 23/14* (2006.01)

(52) U.S. Cl.
  CPC .......... *H01L 23/04* (2013.01); *H01L 23/3107* (2013.01); *H01L 23/49816* (2013.01); *H01L 23/49833* (2013.01); *H01L 23/147* (2013.01); *H01L 2225/06555* (2013.01); *H01L 2924/181* (2013.01)

(58) Field of Classification Search
  CPC ........... H01L 23/49833; H01L 23/3107; H01L 23/585; H01L 23/147; H01L 2225/06555; H01L 2924/181
  See application file for complete search history.

(56) References Cited

U.S. PATENT DOCUMENTS 11,823,991 B2 * 11/2023 Chen .................. H01L 23/49838
2009/0250806 A1 * 10/2009 Wang ................ H01L 23/49833
                                                                257/E23.08

* cited by examiner

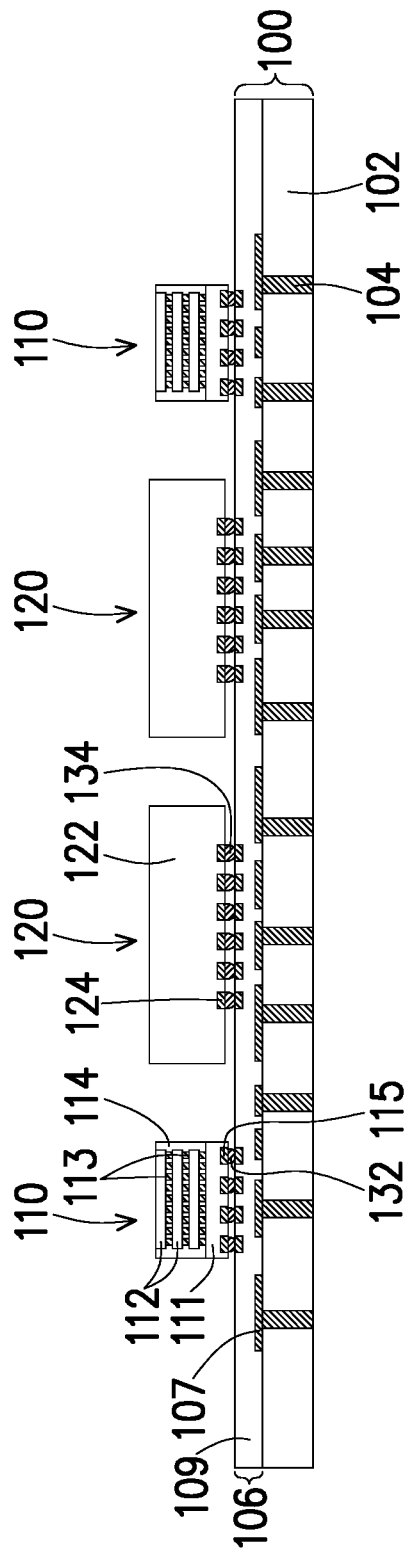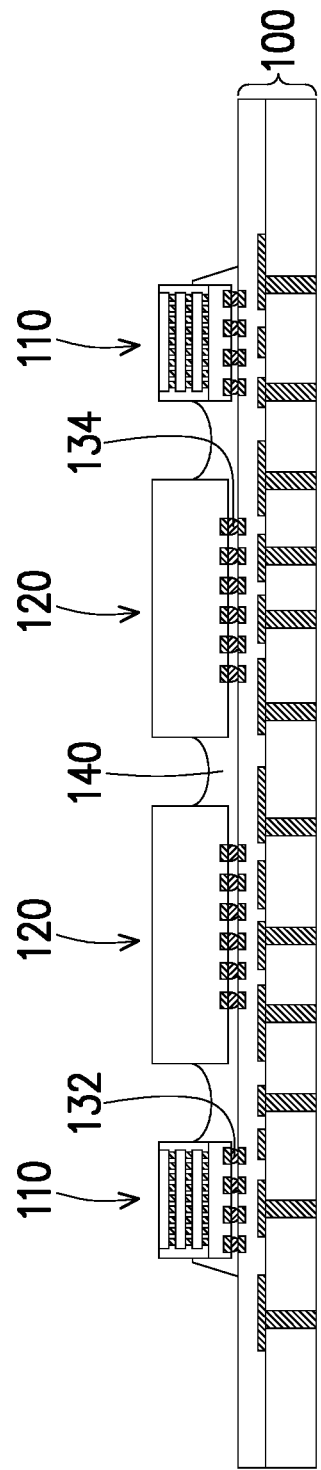

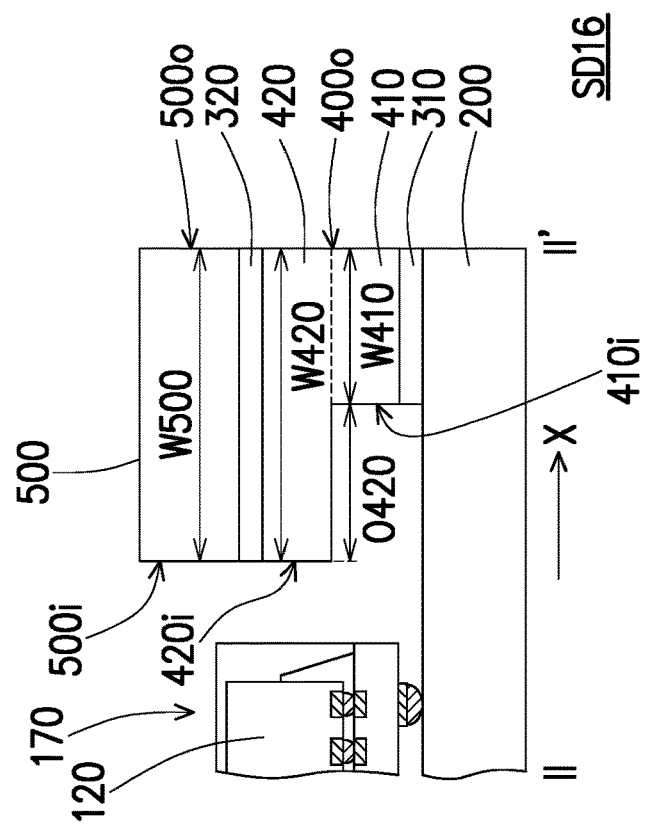
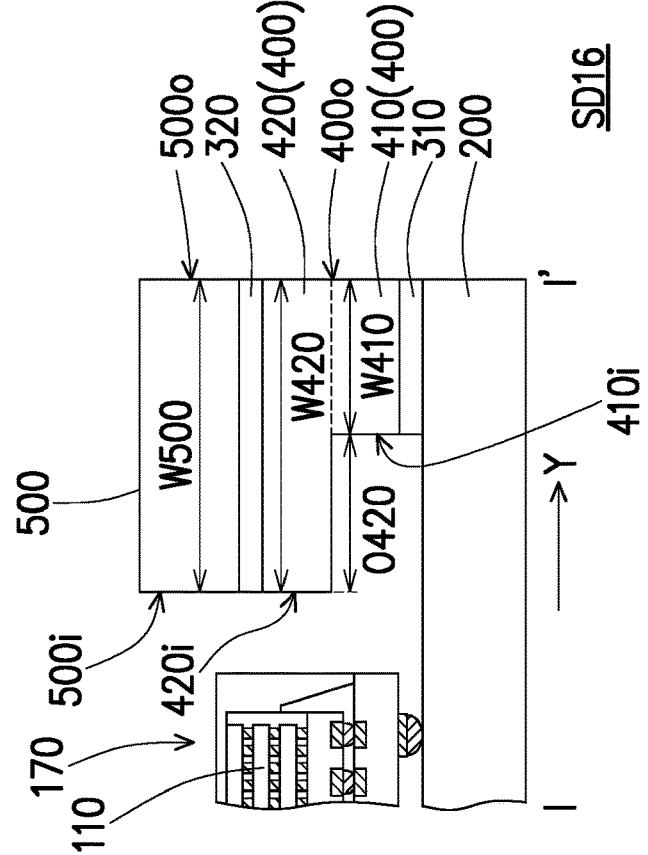
FIG. 4B
FIG. 4A

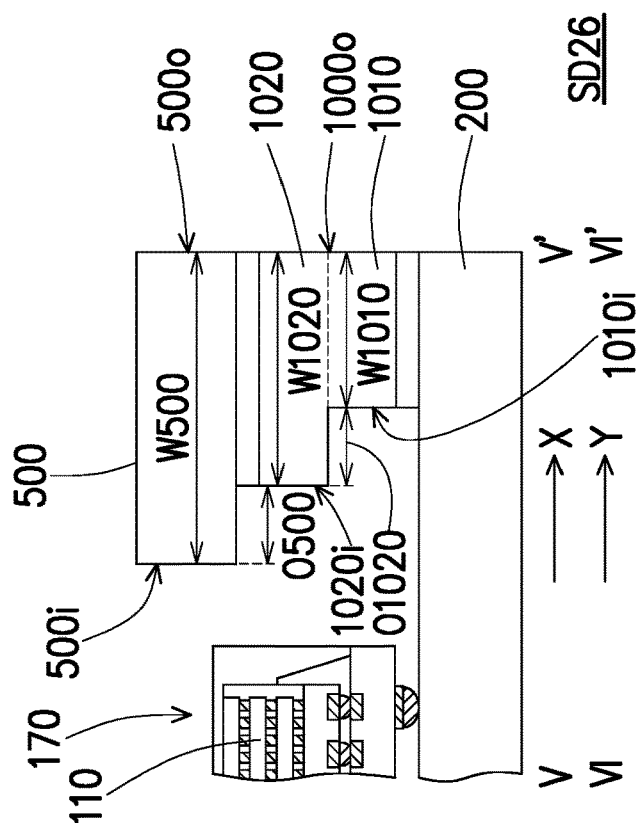
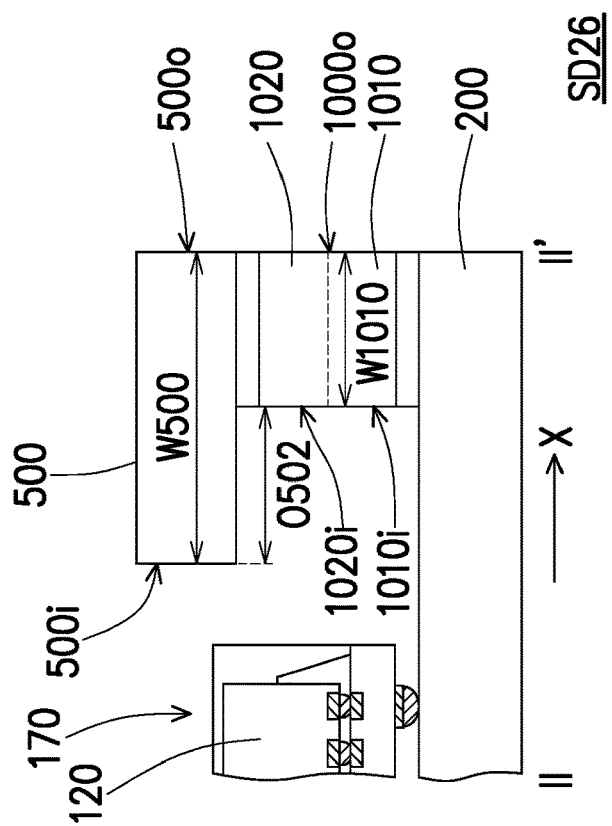
FIG. 9F
FIG. 9E

ENCIRCLING A SEMICONDUCTOR DEVICE WITH STACKED FRAMES ON A SUBSTRATE

CROSS-REFERENCE TO RELATED APPLICATION

This application is a continuation application of and claims the priority benefit of a prior application Ser. No. 17/344,964, filed on Jun. 11, 2021. The prior application Ser. No. 17/344,964 claims the priority benefit of U.S. provisional application Ser. No. 63/166,253, filed on Mar. 26, 2021. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1I are schematic cross-sectional views of structures produced at various stages of a manufacturing method of a semiconductor device according to some embodiments of the present disclosure.

FIG. 4A to FIG. 6B are schematic cross-sectional views of regions of semiconductor devices according to some embodiments of the disclosure.

FIG. 9D to FIG. 9F are schematic cross-sectional views of regions of a semiconductor device according to some embodiments of the disclosure.

DETAILED DESCRIPTION

Figure 1C:
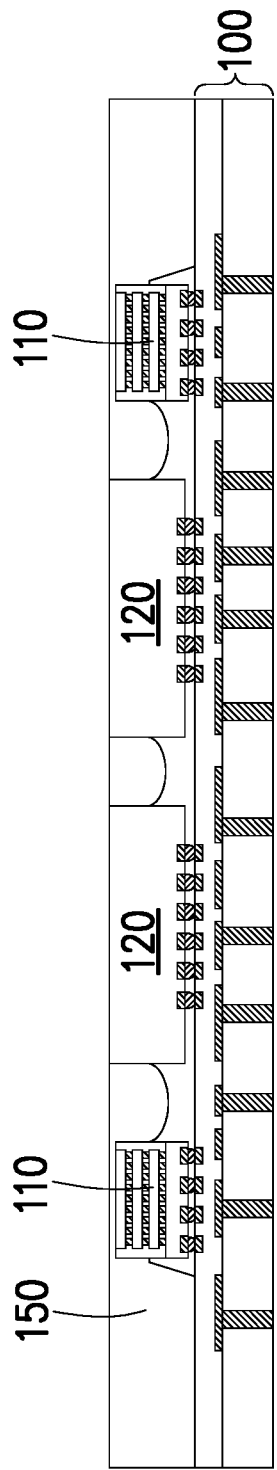

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure relates to semiconductor devices and their manufacturing methods. In some embodiments, the semiconductor devices include one or more semiconductor dies, possibly commonly or individually packaged in encapsulating materials, connected to circuit substrates. In some embodiments, frame rings are disposed on the circuit substrate to encircle the semiconductor die(s). For example, a first frame ring may be disposed along the edges of the circuit substrate, and a second frame ring may be disposed on the first frame ring. In some embodiments, the frame rings form at least one overhang over the circuit substrate. In some embodiments, by including frame rings so configured, warpage of the semiconductor device may be effectively controlled without incurring in excessive area penalty with respect to the circuit substrate. In some embodiments, the encapsulant and/or underfill which may be applied to the semiconductor die(s) may also experience reduced mechanical stress. In some embodiments, delamination or cracking in the semiconductor device may be effectively reduced or even prevented, thus enhancing yield and reliability of the semiconductor device.

FIG. 1A through FIG. 1I are schematic cross-sectional views of structures produced at various stages of a manufacturing method of a semiconductor device SD10 according to some embodiments of the present disclosure. Referring to FIG. 1A, in some embodiments, an interposer 100 is provided. The interposer 100 includes a semiconductor substrate 102, through semiconductor vias (TSVs) 104 extending in the semiconductor substrate 102, and an interconnection structure 106 disposed on the semiconductor substrate 102 and connected to first ends of the TSVs 104. In some embodiments, the interposer 100 includes a semiconductor (e.g., silicon) wafer as the semiconductor substrate 102. In some embodiments, the interconnection structure 106 includes conductive patterns 107 embedded in a dielectric layer 109. For simplicity, the dielectric layer 109 is illustrated as a single dielectric layer and the conductive patterns 107 are illustrated as embedded in the dielectric layer 109, however, in practice, the conductive patterns 107 may be disposed between adjacent pairs of dielectric layers 109, and sections of the conductive patterns 107 may be exposed by openings of the dielectric layers 109. While in FIG. 1A the TSVs 104 are illustrated as extending through the semiconductor substrate 102, in some embodiments the ends of the TSVs 104 opposite to the interconnection structure 106 may still be buried within the semiconductor substrate 102 at the manufacturing stage illustrated in FIG. 1A.

In some embodiments, one or more semiconductor dies 110, 120 are connected to the interconnection structure 106 of the interposer 100. The semiconductor dies 110, 120 do not need to have similar structures to each other. Similarly, the disclosure does not limit the functions for which the semiconductor dies 110, 120 may be configured. For example, the semiconductor dies 110, 120 may be memory dies, such as high-bandwidth memories; logic dies, such as a central processing unit (CPU) die, a graphic processing unit (GPU) die, a micro control unit (MCU) die, an input-output (I/O) die, a baseband (BB) die, or an application processor (AP) die; microelectromechanical systems, such as sensors or the like; chiplets; and so on. In some embodiments, the semiconductor dies 120 may be logic dies, and the semiconductor dies 110 may be memory dies (e.g., DRAM, HMB, or the like).

In some embodiments, a semiconductor die 110 includes a base chip 111, and chips 112 stacked on the base chip 111. The chips 112 may be connected to each other and to the base chip 111 by mini-bumps 113. The chips 111, 112 may include semiconductor substrates having active and/or passive devices formed therein. An encapsulant 114 may be disposed on the base chip 111 to laterally wrap the chips 112 and the mini-bumps 113. A material of the encapsulant 114 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. Conductive pads 115 are formed on the base chip 111, at an opposite side of the base chip 111 with respect to the stacked chips 112. The conductive pads 115 are exposed and available to allow electrical connection to the chips 111, 112 of the semiconductor die 110. In some embodiments, the semiconductor die 120 may be a bare die, including a semiconductor substrate 122 having conductive pads 124 exposed at a front surface of the semiconductor die 120.

In some embodiments, conductive terminals 132, 134 respectively connect the semiconductor dies 110, 120 to the conductive patterns 107 of the interposer 100. For example, the semiconductor dies 110, 120 may be disposed on the interposer 100 with the conductive pads 115, 124 directed towards the interposer 100. In some embodiments, the conductive terminals 132, 134 are micro-bumps connecting the conductive pads 115, 124 of the semiconductor dies 110, 120 to the interposer 100.

In FIG. 1B, in some embodiments, an underfill 140 is disposed between the semiconductor dies 110, 120 and the interposer 100 to protect the conductive terminals 132, 134 from thermal and mechanical stresses. The underfill 140 may include a resin, such as an epoxy resin or the like, and may be formed, for example, by vacuum underfill or other suitable processes. In some embodiments, the underfill 140 fills the interstices between the semiconductor dies 110, 120 and the interposer 100, as well as the gaps between adjacent semiconductor dies 110, 120.

In FIG. 1C, an encapsulant 150 is formed on the interposer 100 to laterally encapsulate the semiconductor dies 110, 120 and the underfill 140. A material of the encapsulant 150 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant 150 is formed by a sequence of over-molding and planarization steps, whereby the material of the encapsulant 150 is formed to initially bury the semiconductor dies 110, 120 and is subsequently removed, for example until the rear surfaces of the semiconductor dies 110 and/or 120 are exposed.

Figure 1D:
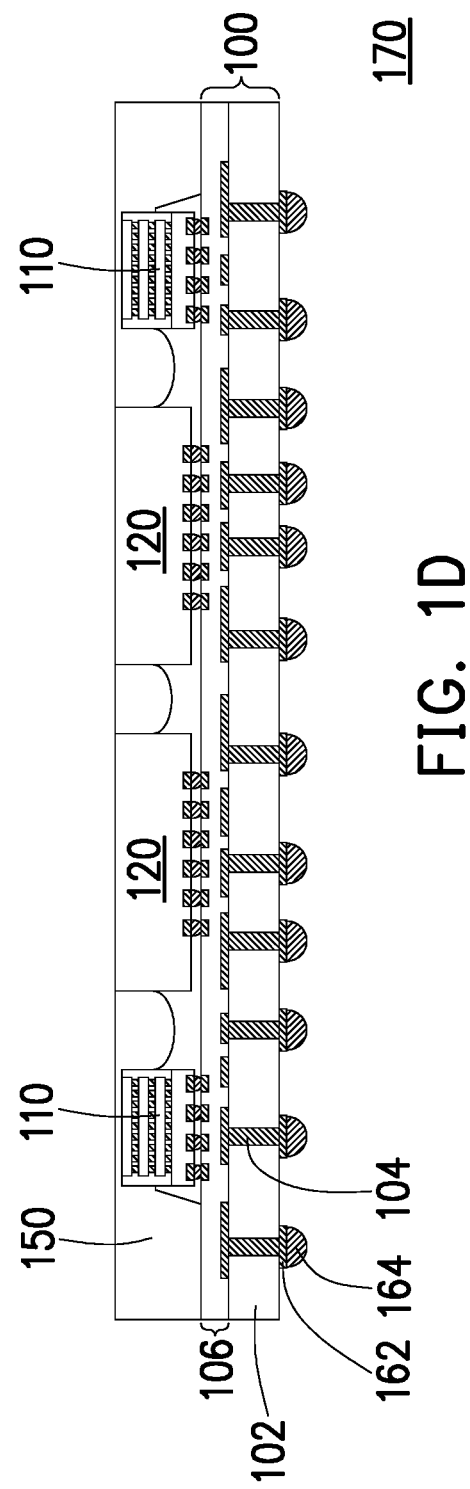

In FIG. 1D, contact pads 162 and connectors 164 are formed on the ends of the TSVs 104 opposite to the semiconductor dies 110, 120. If such ends of the TSVs 104 were still buried in the semiconductor substrate 102, the semiconductor substrate 102 may be preliminary thinned, for example via grinding, until the ends of the TSVs 104 are exposed. As such, the TSVs 104 provide dual side vertical connection through the semiconductor substrate 102, electrically connecting the contact pads 162 to the interconnection structure 106. In some embodiments, the connectors 164 provided on the contact pads 162 are C4 bumps. In some embodiments, the process described above may be performed at a wafer-scale level, so that multiple semiconductor packages 170 may be formed simultaneously, with the interposers 100 being part of a same wafer. Individual semiconductor packages 170 may then be obtained by singulation of the wafer, for example by cutting through the wafer with a mechanical or laser saw.

Figure 1E:
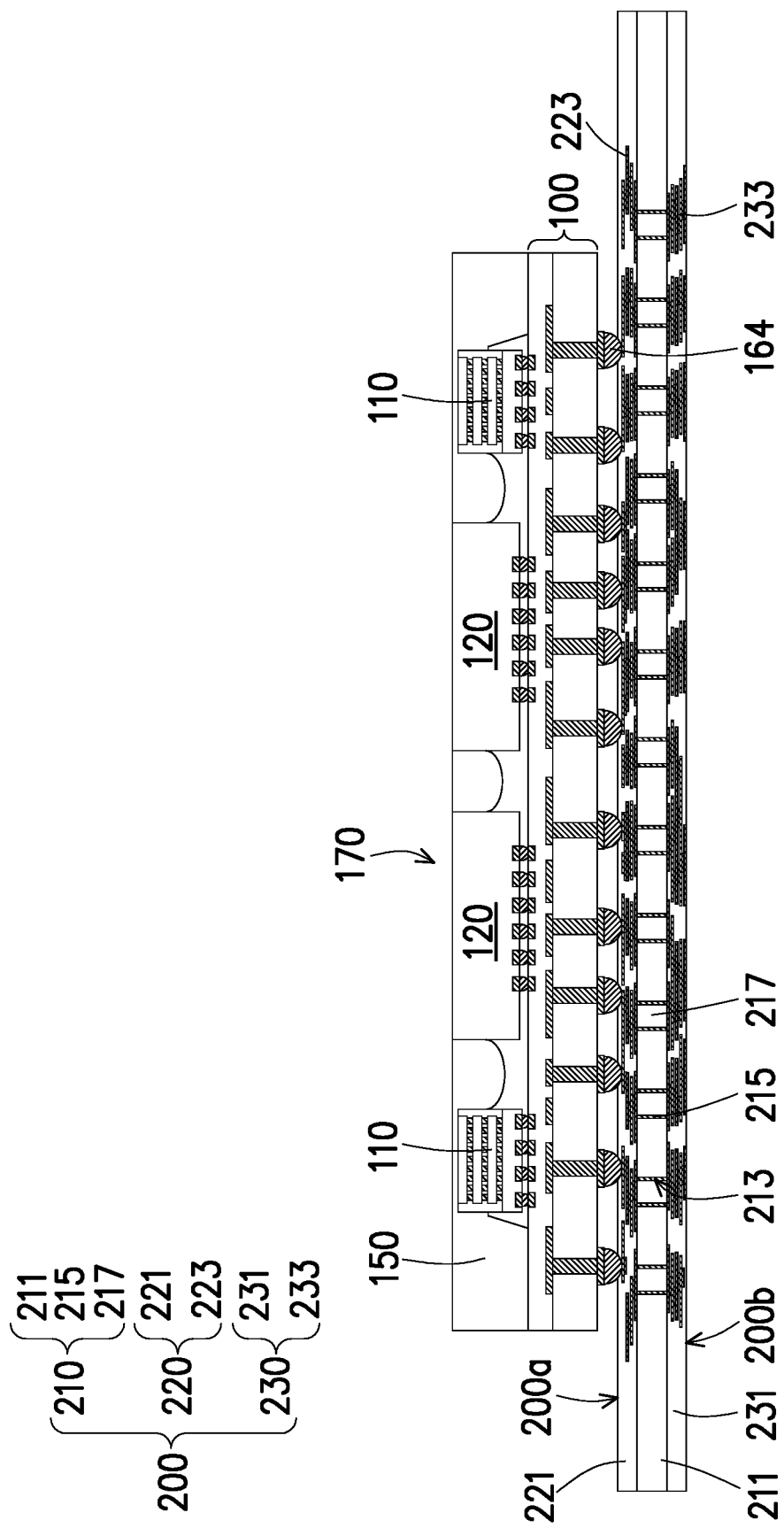

In FIG. 1E, a semiconductor package 170 is disposed on and bonded to a circuit substrate 200. In some embodiments, the circuit substrate 200 includes a core layer 210 and build-up layers 220, 230 disposed on opposite sides of the core layer 210. In some embodiments, the core layer 210 includes a dielectric layer 211 having through holes 213 which extend through the dielectric layer 211 from side to side. The through holes 213 may be lined with conductive material forming the through vias 215. In some embodiments, the through vias 215 may only partially fill (e.g., line the edges of) the through holes 213, which are filled by a dielectric filling 217. In some embodiments, the through holes 213 are filled by the through vias 215. In some embodiments, each build-up layer 220 or 230 respectively includes dielectric layers 221 or 231 and conductive patterns 223 or 233 embedded in the corresponding dielectric layers 221 or 231 and providing electrical connection between opposite sides of the corresponding dielectric layer 221 or 231. For simplicity, the dielectric layers 221, 231 are illustrated as single layers, but it is understood that the conductive patterns 223, 233 are sandwiched by adjacent pairs of dielectric layers 221 or 231. In some embodiments, the build-up layers 220, 230 may independently include more or fewer dielectric layers 221, 231 and conductive patterns 223, 233 than what is illustrated in FIG. 1E, according to routing requirements. In some embodiments, the through vias 215 establish electrical connection between the conductive patterns 223 of one build-up layer 220 with the conductive patterns 233 of the other build-up layer 230. In some embodiments, at least one of the build-up layers 220, 230 (e.g., the build-up layer 220) is exposed for further processing, and the semiconductor package 170 is connected to the exposed side 200a of the circuit substrate 200. For example, the semiconductor package 170 may be disposed on the circuit substrate 200 with the connectors 164 landing on exposed conductive patterns 223 of the build-up layer 220. In some embodiments, the connectors 164 are C4-bumps, and the semiconductor package 170 is flip-chip bonded to the circuit substrate 200. In some embodiments, an underfill (not shown) is disposed between the semiconductor package 170 and the circuit substrate 200 to protect the connectors 164 from thermal and mechanical stresses. The underfill may include a resin, such as an epoxy resin or the like, and may be formed, for example, by vacuum underfill or other suitable processes.

Figure 1F:
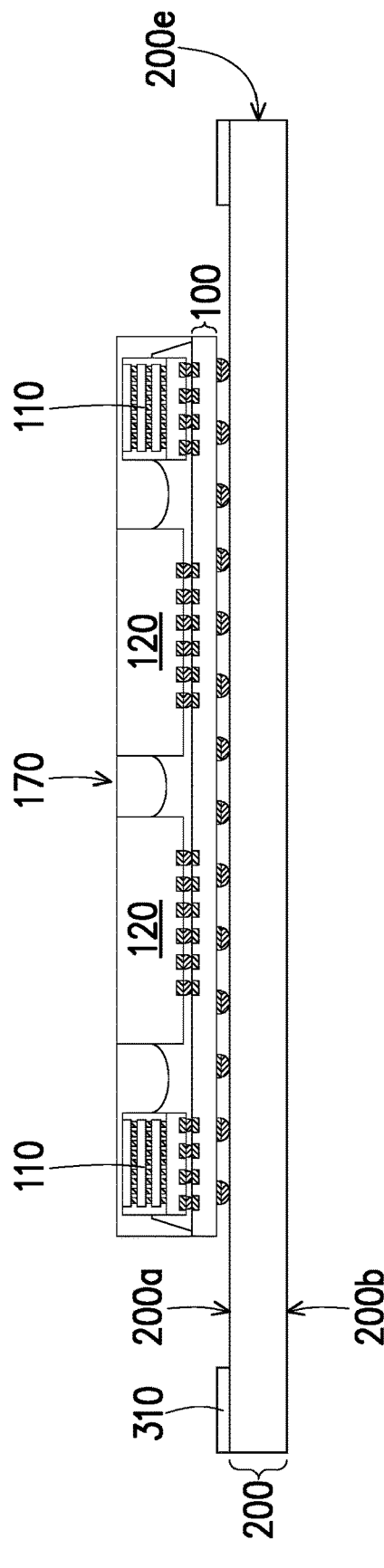

In FIG. 1F, an adhesive 310 is disposed on the side 200a of the circuit substrate 200, beside the semiconductor package 170. For the sake of simplicity, the semiconductor package 170 and the circuit substrate 200 may be illustrated in a simplified manner starting from FIG. 1F, without implying that the structure has changed with respect to what was illustrated in FIG. 1E. In some embodiments, the adhesive 310 is disposed encircling the semiconductor package 170. In some embodiments, the adhesive 310 may be disposed in proximity of the outer periphery of the circuit substrate 200. In some embodiments, the adhesive 310 is disposed following the profile of the semiconductor package 170 and/or the profile of the outer periphery of the circuit substrate 200. For example, if the circuit substrate 200 has a rectangular footprint, the adhesive 310 may have a rectangular annular shape. Similarly, if the circuit substrate 200 has a circular footprint, the adhesive 310 may have a circular annular shape. For example, the adhesive 310 may be disposed along the outer edge 200e of the circuit substrate 200. The outer edge 200e of the circuit substrate 200 is the peripheral surface joining the side 200a of the circuit substrate 200 with the opposite side 200b. In some embodiments, multiple portions of adhesive 310 are disposed on the circuit substrate 200. That is, the adhesive 310 may be discontinuous, presenting gaps in which the circuit substrate 200 is exposed in between consecutive portions of adhesive 310. In some embodiments, the adhesive 310 includes a thermocurable adhesive, a photocurable adhesive, a thermally conductive adhesive, a thermosetting resin, a waterproof adhesive, a lamination adhesive, or a combination thereof. In some embodiments, the adhesive 310 includes a metallic layer (not shown) with solder paste (not shown) deposited thereon. The type of adhesive 310 may be selected as a function of the materials being adhered. According to the material used, the adhesive 310 may be formed by deposition, lamination, printing, plating, or any other suitable technique.

Figure 1G:
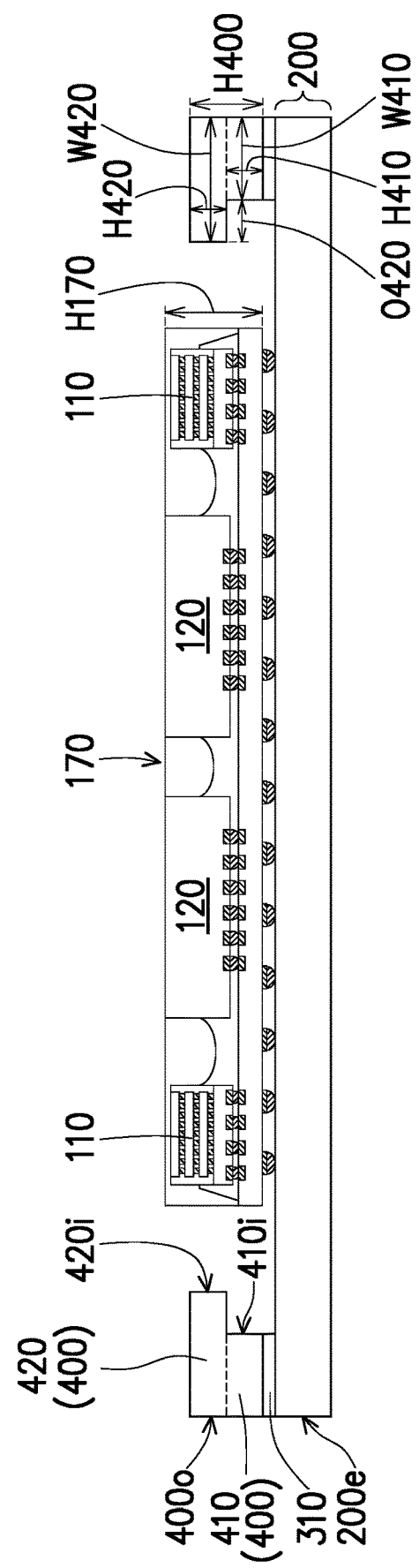

In FIG. 1G, a frame ring 400 is bonded to the circuit substrate 200 via the adhesive 310. In some embodiments, the frame ring 400 has an annular shape encircling the semiconductor package 170. The frame ring 400 may be placed on the circuit substrate 200 in correspondence of the adhesive 310, and bonded to the circuit substrate 200 for example by curing (or pre-curing) the adhesive 310. In some embodiments, the frame ring 400 includes any suitable material, such as a metal, a metallic alloy, a semiconductor material or the like. For example, the frame ring 400 may include stainless steel, silicon carbide alloy, machinable ceramic, dummy silicon, kovar, invar, molybdenum, copper- or nickel-clad molybdenum, copper-clad Invar, copper tungsten, aluminum, diamond composites, metal diamond alloys (e.g., silver diamond) or a combination thereof.

In some embodiments, the frame ring 400 includes a base portion 410 contacting the adhesive and an overhang portion 420 disposed on the base portion 410 and protruding from the base portion 410 towards the semiconductor package 170. That is, the frame ring 400 may have an inverted step shape, with the overhang portion 420 including an overhang O420 over the circuit substrate 200. The base portion 410 and the overhang portion 420 may be integrally formed (formed as a single piece). For example, the frame ring 400 has an outer edge 400o vertically aligned with the outer edge 200e of the circuit substrate 200, which outer edge 400o is common to the base portion 410 and the overhang portion 420. The base portion 410 has an inner edge 410i opposite to the outer edge 400o, and disposed at a horizontal distance from the outer edge 400o corresponding to the width W410 of the base portion 410. The overhang portion 420 also has an inner edge 420i opposite to the outer edge 400o, and disposed at a horizontal distance from the outer edge 400o corresponding to the width W420 of the overhang portion 420. The widths W410 and W420 may be measured along directions perpendicular with respect to the plane of the outer edge 400o of the frame ring 400 and of the outer edge 200e of the circuit substrate 200. Both the inner edge 410i and the inner edge 420i may face the semiconductor package 170. The width W420 is greater than the width W410, so that the inner edge 420i protrudes further towards the center of the circuit substrate 200 than the inner edge 410i. The overhang O420 may correspond to the difference between the width W420 and the width W410. In some embodiments, the total vertical height H400 of the frame ring 400 is comparable to the vertical height H170 of the semiconductor package 170. For example, the height H400 may be up to the total vertical height H170 of the semiconductor package 170. The height H400 corresponds to the sum of the height H410 of the base portion 410 and the height H420 of the overhang portion H420. In some embodiments, the height H410 of the base portion 410 is sufficient to dispose additional components (e.g., integrated passive devices or the like) underneath the overhang O420. In some embodiments, the height H410 may be considered as the vertical distance from the bottom of the base portion 410 in contact with the adhesive 310 to the level height of the lower surface of the overhang portion 420.

Figure 1H:
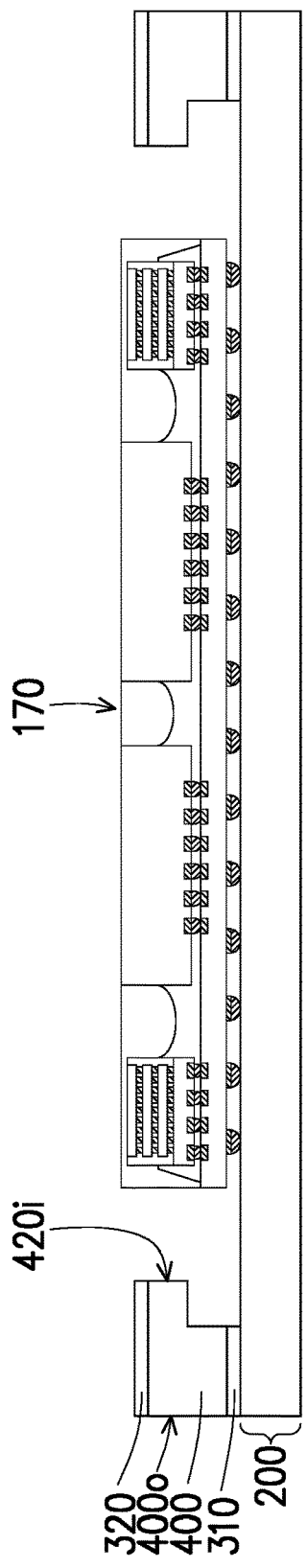

In FIG. 1H, another adhesive 320 is disposed on top of the frame ring 400. In some embodiments, the adhesive 320 is disposed encircling the semiconductor package 170, covering the top surface of the frame ring 400. In some embodiments, the adhesive 320 may be disposed in proximity of the outer edge 400o of the frame ring 400. In some embodiments, the adhesive 320 extends from the outer edge 400o to the inner edge 420i of the frame ring 400. In some embodiments, multiple portions of adhesive 320 are disposed on the frame ring 400. That is, the adhesive 320 may be discontinuous, presenting gaps in which the frame ring 400 is exposed in between adjacent portions of adhesive 320. In some embodiments, the adhesive 320 includes a thermocurable adhesive, a photocurable adhesive, a thermally conductive adhesive, a thermosetting resin, a waterproof adhesive, a lamination adhesive, or a combination thereof. In some embodiments, the adhesive 320 includes a metallic layer (not shown) with solder paste (not shown) deposited thereon. The type of adhesive 320 may be selected as a function of the materials being adhered. According to the material used, the adhesives 320 may be formed by deposition, lamination, printing, plating, or any other suitable technique.

Figure 1I:
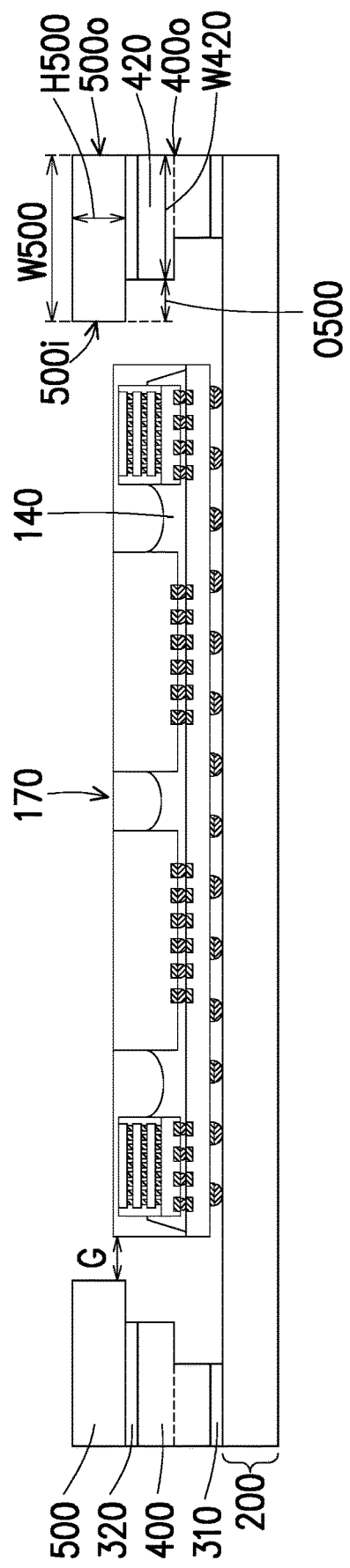

In FIG. 1I, the semiconductor device SD10 is illustrated as further including the frame ring 500 secured to the frame ring 400 via the adhesive 320. In some embodiments, the frame ring 500 is disposed on the frame ring 400 contacting the adhesive 320, and is subsequently bonded to the frame ring 400 by curing (or pre-curing) the adhesive 320. In some embodiments, the frame ring 500 includes any suitable material, such as a metal, a metallic alloy, a semiconductor material or the like. For example, the frame ring 500 may include stainless steel, silicon carbide alloy, machinable ceramic, dummy silicon, kovar, invar, molybdenum, copper- or nickel-clad molybdenum, copper-clad Invar, copper tungsten, aluminum, diamond composites, metal diamond alloys (e.g., silver diamond) or a combination thereof. In some embodiments, the frame ring 500 includes a different material from the frame ring 400. The materials of the frame ring 400 and the frame ring 500 may be selected taking into account the respective coefficients of thermal expansion, as well as the coefficient of thermal expansion of the material of the circuit substrate 200. For example, the material of the frame ring 400 may be selected so as to have a smaller coefficient of thermal expansion than the material of the circuit substrate 200, while the material of the frame ring 500 may be selected to have a higher coefficient of thermal expansion than the material of the circuit substrate 200. That is, the material of the circuit substrate 200 may have an intermediate coefficient of thermal expansion with respect to the materials of the frame ring 400 and the frame ring 500.

In some embodiments, the frame ring 500 is stacked on the frame ring 400 via the adhesive 320. In some embodiments, an outer edge 500o of the frame ring 500 is vertically aligned with the outer edge 400o of the frame ring 400. An inner edge 500i of the frame ring 500 opposite to the outer edge 500o may horizontally protrude with respect to the frame ring 400, so that the frame ring 500 also includes an overhang O500 over the circuit substrate 200 with respect to the frame ring 400. That is, the width W500 of the frame ring 500 corresponding to the distance between the inner edge 500i and the outer edge 500o of the frame ring 500 may be larger than the with W420 of the overhang portion 420 of the frame ring 400. That is, the frame ring 500 may protrude further towards the semiconductor package 170 than the frame ring 400. In some embodiments, a certain gap G exists between the inner edge 500i of the frame ring 500 and the semiconductor package 170. For example, the gap G may be larger than about 700 micrometers, such as about 1 mm. That is, the frame ring 400 and the frame ring 500 may encircle the semiconductor package 170 without covering it. In some embodiments, the height H500 of the frame ring 500 is not particularly limited, and may be selected according to the expected warpage of the semiconductor device SD10 as well as to the desired total thickness of the semiconductor device SD10.

In some embodiments, by including frame rings 400 and/or 500 having overhangs O420 and/or O500 over the circuit substrate 200, warpage of the semiconductor device SD10 may be effectively controlled without incurring in excessive area penalty with respect to the circuit substrate 200. As a way of example and not of limitation, simulations of the expected warpage for semiconductor devices having the same contact area between the frame ring 400 and the circuit substrate 200 and differing for including or not the overhangs O420 and O500 reveal that inclusion of the overhangs O420 and O500 may effectively reduce the warpage of the semiconductor device SD10 when tested for stress at room temperature or at higher temperature. For example, a reduction in warpage of about 5% is expected at both temperatures for the semiconductor device SD10 compared with a similar semiconductor device not including the overhangs O420 and O500. Furthermore, stress at the level of the underfill 140 of the semiconductor package 170 may also be reduced, in some embodiments up to about 20% with respect to a semiconductor device in which no overhangs are included. As such, delamination or cracking of the underfill 140 may be effectively reduced or even prevented. In some embodiments, by including frame rings 400 and/or 500 having the overhangs O420 and/or O500, it is possible to include heavier and/or larger frame rings 400 and/or 500 with limited size penalty if any, without compromising the possibility of further functionalization of the semiconductor device SD10. This, in turn, may lead to effective control of the warpage and/or the mechanical stress at the level of the underfill 140, thus increasing the mechanical stability and reliability of the semiconductor device SD10. That is, by including frame rings 400 and/or 500 having the overhangs O420 and/or O500, it may be possible to effectively control warpage and/or underfill stress without incurring in an area penalty with respect to the circuit substrate 200.

Figure 2A:
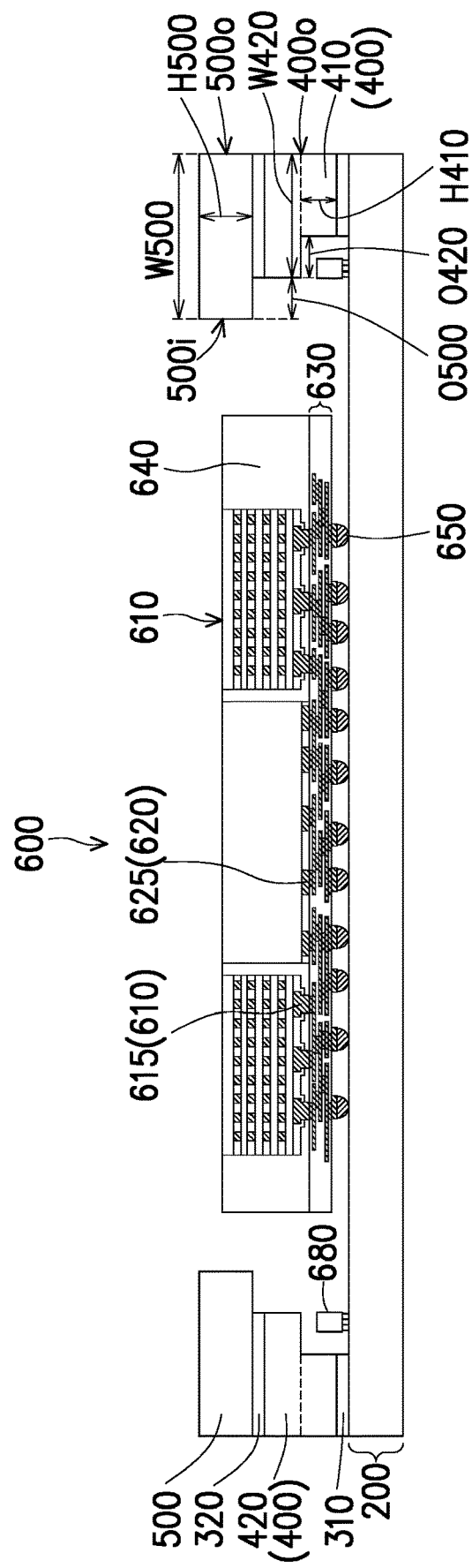
FIG. 2A and FIG. 2B are schematic cross-sectional views of semiconductor devices according to some embodiments of the present disclosure.

While a certain structure of the semiconductor package 170 as chips-on-wafer has been illustrated in the drawings and described above, the disclosure is not limited thereto, and other types of semiconductor packages (e.g., chip scale packages, InFO, PoP, and so on) are contemplated in the disclosure. For example, in FIG. 2A is illustrated a cross-sectional view of a semiconductor device SD12 according to some embodiments of the disclosure. The semiconductor device SD12 of FIG. 2A may be similar to the semiconductor device SD10 of FIG. 1I, and the description of corresponding elements and manufacturing processes equally applies. In some embodiments, the semiconductor device SD12 includes an InFO package as the semiconductor package 600 bonded to the circuit substrate 200 and encircled by the frame rings 400 and 500. In some embodiments, the semiconductor package 600 includes one or more semiconductor dies 610, 620, which may have same or similar structures to the semiconductor dies 110, 120 previously described with reference to FIG. 1A. In some embodiments, the semiconductor dies 610, 620 are directly connected to a redistribution structure 630. That is, the contact pads 615, 625 of the semiconductor dies 610, 620 may be in direct contact with the redistribution structure 630. In some embodiments, the semiconductor dies 610, 620 are encapsulated in an encapsulant 640, and the redistribution structure 630 extends on the semiconductor dies 610, 620 and the encapsulant 640. Conductive terminals 650 disposed on an opposite side of the redistribution structure 630 with respect to the semiconductor dies 610, 620 connect the redistribution structure 630 to the circuit substrate 200. In some embodiments, the conductive terminals 650 are C4-bumps. In some embodiments, an underfill (not illustrated) is disposed between the semiconductor package 600 and the circuit substrate 200 to protect the conductive terminals 650 from thermal and mechanical stresses. In some embodiments, the semiconductor device SD12 further includes surface mount devices 680 connected to the circuit substrate 200 and disposed beside the semiconductor package 600, for example underneath the overhangs O420 and/or O500. In some embodiments, the surface mount devices 680 are chips of integrated passive devices and function as capacitors, inductors, resistors, or the like. In some embodiments, each surface mount device 680 may independently function as a capacitor having different capacitance values, resonance frequencies, and/or different sizes, an inductor, or the like. In some embodiments, the surface mount devices 680 are disposed with the front surfaces directed towards the circuit substrate 200, so as to be electrically connected to the circuit substrate 200. In some embodiments, the surface mount devices 680 are placed over the circuit substrate 200 through a pick-and-place method, and are connected to the circuit substrate 200 before installing the frame ring 400. For example, the surface mount devices 680 may be connected to the circuit substrate 200 after the semiconductor package 170 is connected, before or after the adhesive 310 is disposed on the circuit substrate 200. The adhesives 310, 320 and the frame rings 400 and 500 may be disposed on the circuit substrate 200 as previously described, aligned so that the surface mount devices 680 are located under the overhangs O420 and/or O500. In some embodiments, by including frame rings 400 and/or 500 having overhangs O420 and/or O500, it is possible to further functionalize the semiconductor device SD12 by disposing the surface mount devices 680 under the overhangs O420 and/or O500, without incurring in size penalty for the inclusion of the frame rings 400 and/or 500. That is, by setting the heights H410 and/or H500 of the frame rings 400 and/or 500 as sufficiently large so that the surface mount devices 680 may fit under the overhangs O420 and/or O500, it may be possible to increase the size of the frame rings 400 and/or 500 for effective warpage control without incurring in an area penalty with respect to the circuit substrate 200 because of the increased width of the frame rings 400 and/or 500.

Figure 2B:
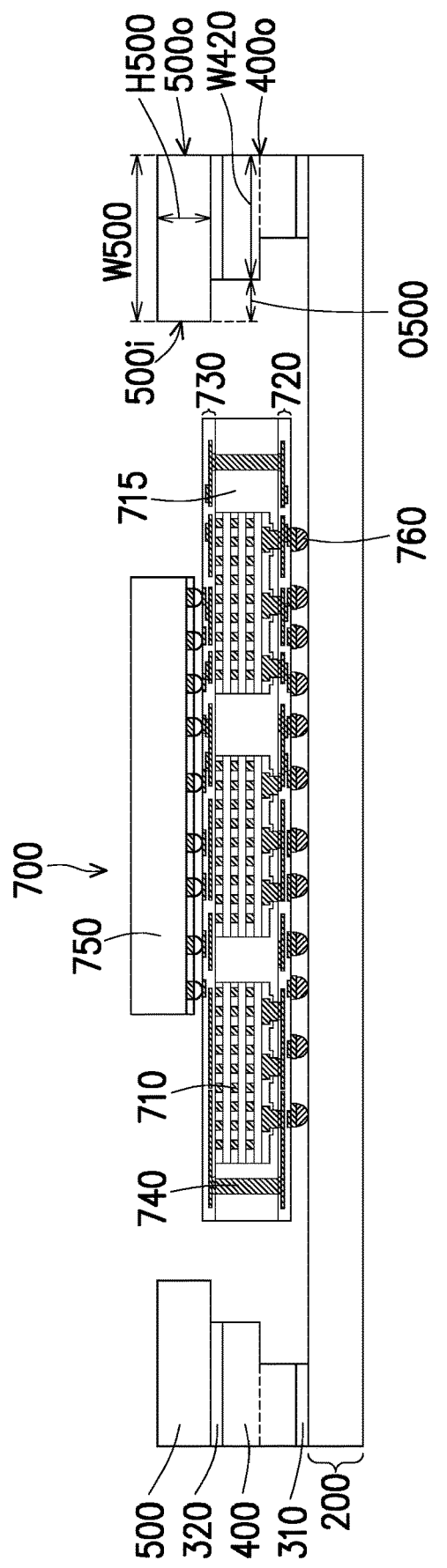

In some embodiments, as illustrated in FIG. 2B, a semiconductor device SD14 may include an InFO_PoP package as the semiconductor package 700 bonded to the circuit substrate 200 and encircled by the frame rings 400 and 500. For example, the semiconductor package 700 may include semiconductor dies 710, which may have similar structures to the semiconductor dies 110 of FIG. 1A, encapsulated by an encapsulant 715. The semiconductor dies 710 may be directly connected to a redistribution structure 720 extending on a side of the semiconductor dies 710 and the encapsulant 715. Another redistribution structure 730 may extend at an opposite side of the semiconductor dies 710 and the encapsulant 715 with respect to the redistribution structure 720, and through interlayer vias (TIVs) 740 may establish electrical connection between the redistribution structures 720 and 730 extending through the encapsulant 715. A top package 750 may be connected to the redistribution structure 730, at an opposite side with respect to the semiconductor dies 710, and may be electrically connected to the semiconductor dies 710 by the redistribution structures 720, 730, and the TIVs 740. Other aspects of the semiconductor device SD14 as well as of its manufacturing process may be similar to what was described above for the semiconductor device SD10 of FIG. 1I.

It will be apparent that while the semiconductor devices SD10 of FIG. 2I, SD12 of FIG. 2A, and SD14 of FIG. 2B have been illustrated with certain structures of the corresponding semiconductor packages 170, 600, or 700, the disclosure does not limit the structure of the semiconductor packages included in the semiconductor devices. Furthermore, while in the following the semiconductor devices will be illustrated as including the semiconductor package 170, embodiments including different semiconductor packages are also contemplated within the scope of the disclosure. Similarly, the surface mount devices 680 illustrated for the semiconductor device SD12 of FIG. 2A may be mounted in similar positions in any one of the semiconductor devices disclosed here.

Figure 3B:
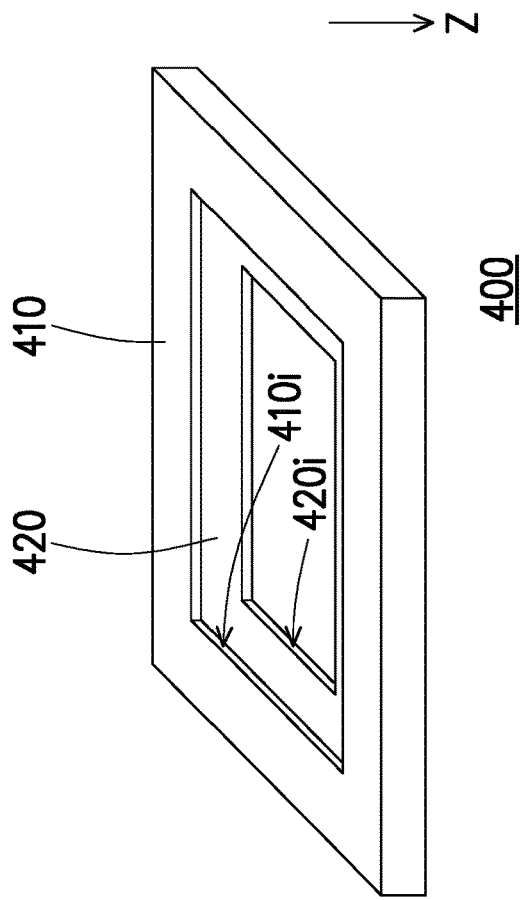
FIG. 3B is a schematic perspective view of a frame ring according to some embodiments of the disclosure.
Figure 3A:
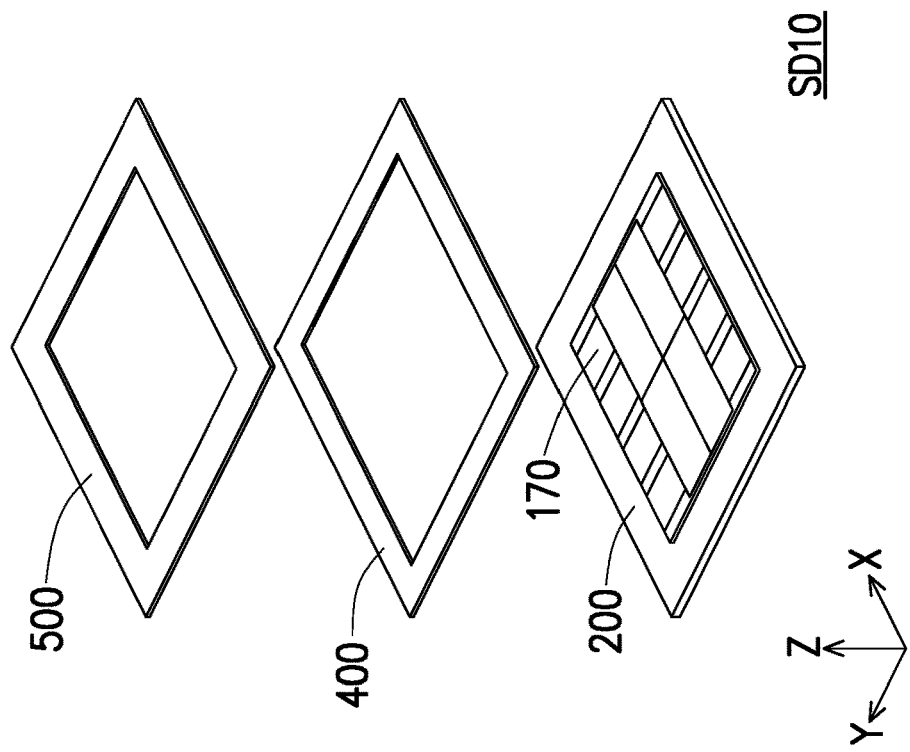
FIG. 3A is a schematic exploded view of a semiconductor device according to some embodiments of the disclosure.
Figure 3D:
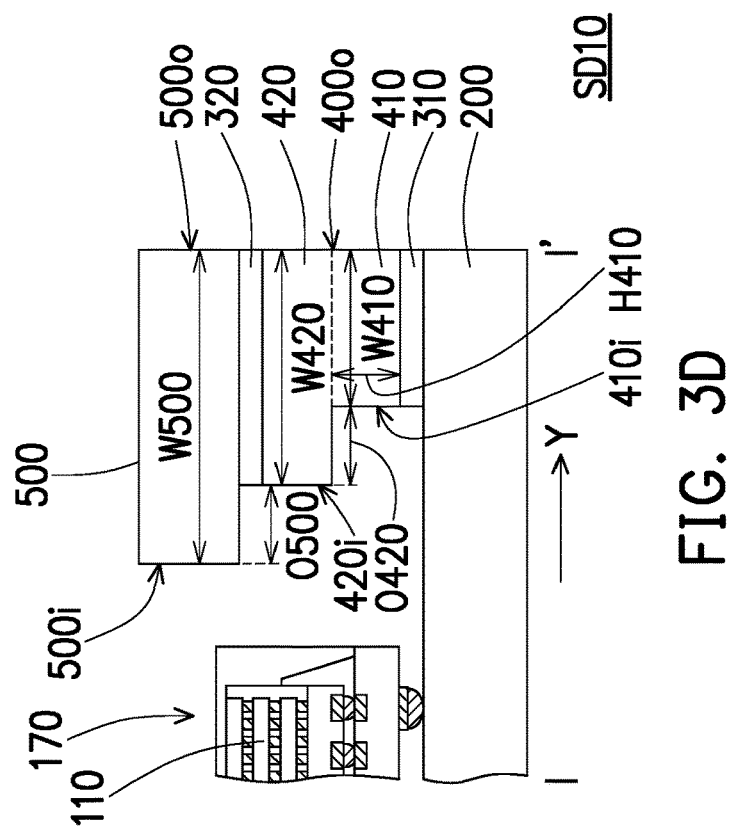
FIG. 3D and FIG. 3E are schematic cross-sectional views of regions of a semiconductor device according to some embodiments of the disclosure.
Figure 3C:
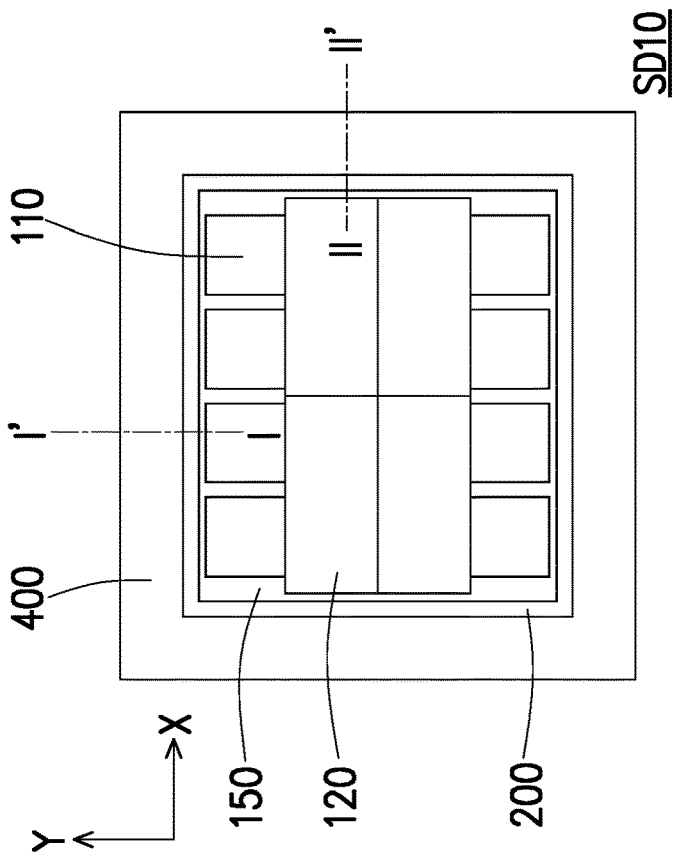
FIG. 3C is a schematic top view of a semiconductor device according to some embodiments of the disclosure.
Figure 3E:
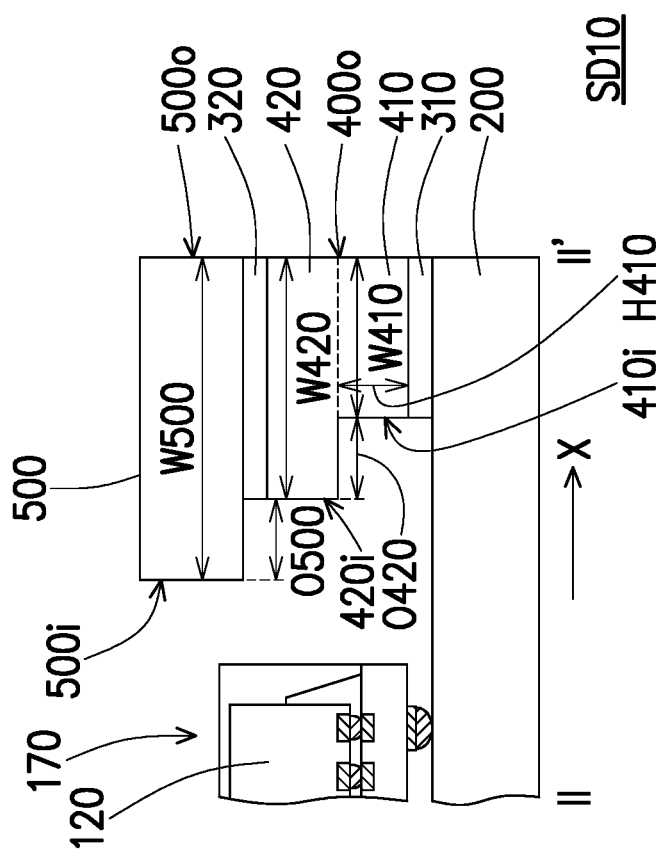

FIG. 3A is a schematic exploded view of the semiconductor device SD10 according to some embodiments of the disclosure. FIG. 3B is a schematic perspective view of the frame ring 400 according to some embodiments of the disclosure. FIG. 3B has a different orientation along the Z direction with respect to FIG. 3A, so that the bottom surface of the frame ring 400 is visible in FIG. 3B while the top surface of the frame ring 400 is visible in FIG. 4A. FIG. 3C is a schematic top view of the semiconductor device SD10 according to some embodiments of the disclosure. In the schematic top view of FIG. 3C, the frame ring 500 has been omitted for clarity of illustration. FIG. 3D and FIG. 3E are schematic cross-sectional views of regions of the semiconductor device SD10 respectively taken along the lines I-I' and II'II' illustrated in FIG. 3C. Referring to FIG. 1I and to FIG. 3A to FIG. 3E, in the semiconductor device SD10 the frame ring 400 includes the base portion 410 and the overhang portion 420 protruding towards the semiconductor package 170, so that the inner edge 420i of the overhang portion 420 is closer to the semiconductor package 170 than the inner edge 410i of the base portion 410. In some embodiments, the overhang portion 420 may protrude continuously with respect to the base portion 410, so that the overhang O420 may be included along all borders of the frame ring 400, protruding along both of the X direction and the Y direction. Similarly, the frame ring 500 may protrude continuously with respect to the overhang portion 420, so that the overhang O500 may be included along all borders of the frame ring 500, protruding along both of the X direction and the Y direction in some embodiments. In some embodiments, the overhangs O420 and O500 may have the same size along the X direction and the Y direction, but the disclosure is not limited thereto. In some embodiments, the overhang O420 and/or the overhang O500 may have a different dimensions along the X direction and the Y direction. That is, the widths W410, W420, W500 may be different along the X direction with respect to the Y direction.

FIG. 4A and FIG. 4B are schematic cross-sectional views of regions of a semiconductor device SD16 according to some embodiments of the disclosure. The semiconductor device SD16 may have a similar structure and be manufactured according to a similar process to the semiconductor device SD10 of FIG. 3A. In some embodiments, the views of FIG. 4A and FIG. 4B are taken along regions corresponding to the regions of the semiconductor device SD10 illustrated in FIG. 3D and FIG. 3E. In some embodiments, in the semiconductor device SD16, the width W500 of the frame ring 500 may be substantially equal to the width W420 of the overhang portion 420 of the frame ring 400. For example, the outer edge 500o of the frame ring 500 may still be vertically aligned with the outer edge 400o of the frame ring 400, while the inner edge 500i of the frame ring 500 may be vertically aligned with the inner edge 420i of the overhang portion 420. That is, in the semiconductor device SD16, the overhang O500 may be omitted, while the overhang O420 is still included. In some embodiments, by varying the relative configuration of the frame ring 400 and the frame ring 500, warpage of the circuit substrate 200 and stress of the underfill 140 (illustrated, e.g., in FIG. 1I) may be further tuned. For example, the configuration illustrated for the semiconductor device SD16 may result in even lower warpage than the configuration illustrated for the semiconductor device SD10 of FIG. 3D and FIG. 3E, even though, in some embodiments, increased stress at the level of the underfill 140 may be observed. In some embodiments, there may be a trade-off between control of the warpage of the circuit substrate 200 and the stress experienced at the level of the underfill 140. Other aspects of the semiconductor device SD16 may be the same as previously described for the semiconductor device SD10 (illustrated, e.g., in FIG. 3A).

Figure 5B:
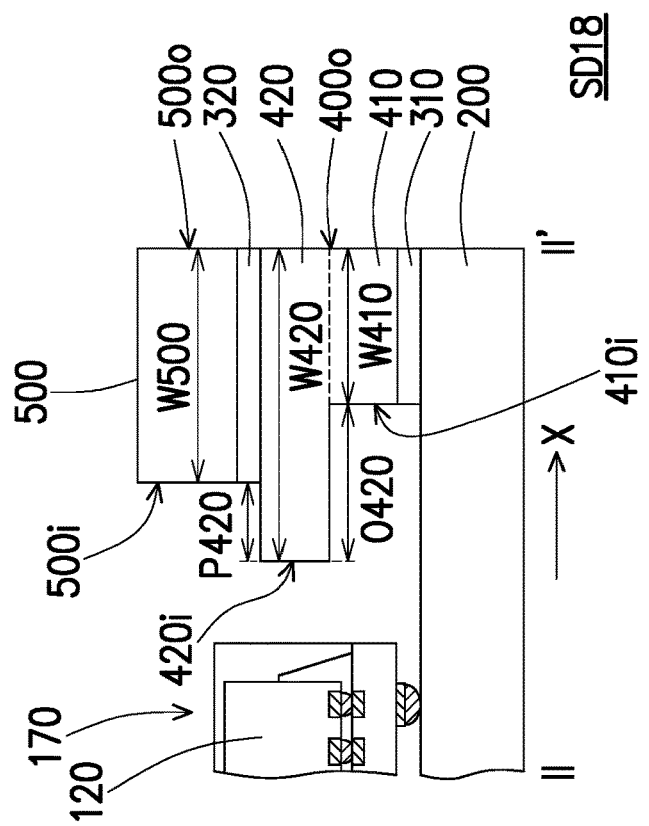
Figure 5A:
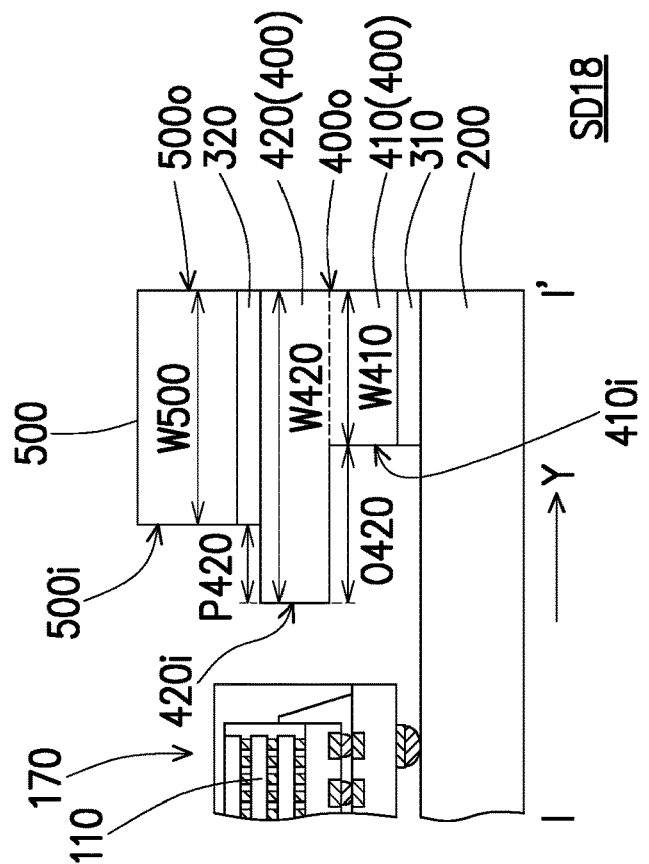

FIG. 5A and FIG. 5B are schematic cross-sectional views of regions of a semiconductor device SD18 according to some embodiments of the disclosure. The semiconductor device SD18 may have a similar structure and be manufactured according to a similar process to the semiconductor device SD10 of FIG. 3A. In some embodiments, the views of FIG. 5A and FIG. 5B are taken along regions corresponding to the regions of the semiconductor device SD10 illustrated in FIG. 3D and FIG. 3E. In some embodiments, in the semiconductor device SD18, the width W500 of the frame ring 500 is smaller than the width W420 of the overhang portion 420 of the frame ring 400. For example, the outer edge 500o of the frame ring 500 may still be vertically aligned with the outer edge 400o of the frame ring 400, while inner edge 420i of the overhang portion 420 may protrude with respect to both of the inner edge 500i of the frame ring 500 and the inner edge 410i of the base portion 410. That is, in the semiconductor device SD18, the overhang portion 420 may include the overhang O420 with respect to the base portion 410 and the protrusion P420 with respect to the frame ring 500. In some embodiments, the adhesive 320 may be disposed between the frame ring 400 and the frame ring 500, so that the frame ring 400 may remain exposed in correspondence of the protrusion P420. Other aspects of the semiconductor device SD18 may be the same as previously described for the semiconductor device SD10 (illustrated, e.g., in FIG. 3A).

Figure 6A:
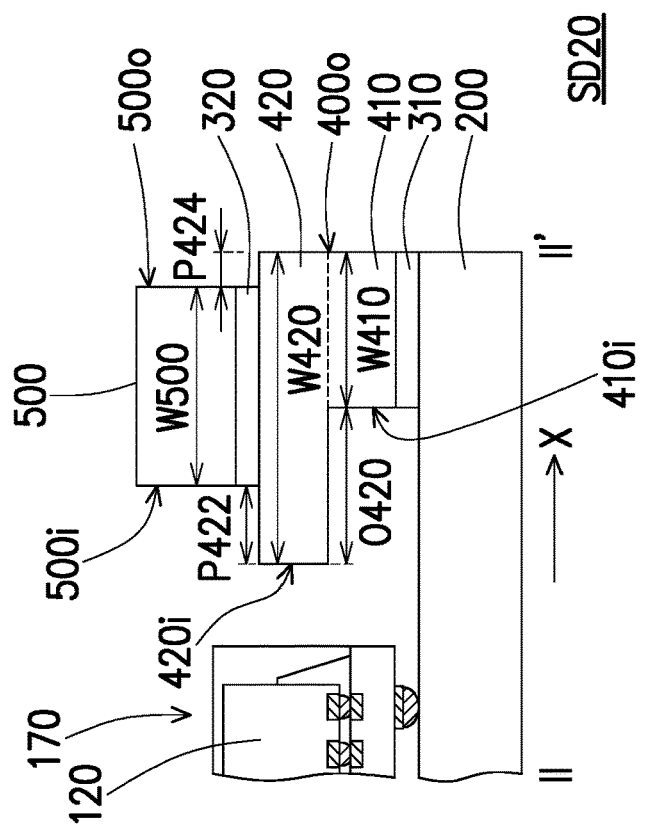
Figure 6B:
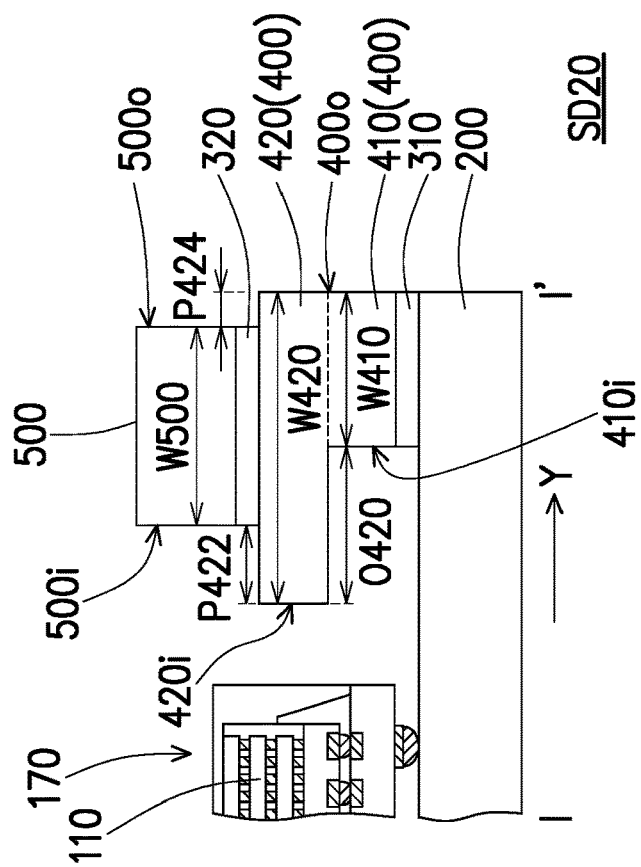

FIG. 6A and FIG. 6B are schematic cross-sectional views of regions of a semiconductor device SD20 according to some embodiments of the disclosure. The semiconductor device SD20 may have a similar structure and be manufactured according to a similar process to the semiconductor device SD10 of FIG. 3A. In some embodiments, the views of FIG. 6A and FIG. 6B are taken along regions corresponding to the regions of the semiconductor device SD10 illustrated in FIG. 3D and FIG. 3E. In some embodiments, in the semiconductor device SD20, the width W500 of the frame ring 500 is smaller than the width W420 of the overhang portion 420 of the frame ring 400. In some embodiments, the outer edge 500o and the inner edge 500i of the frame ring 500 are both vertically misaligned with the inner edge 420i and the outer edge 400o of the overhang portion 420. For example, the overhang portion 420 may laterally protrude at opposite sides of the frame ring 500, thus having the protrusion P422 at the side of the inner edge 500i and the protrusion P424 at the side of the outer edge 500o. Furthermore, the overhang portion 420 may still have the overhang O420 with respect to the base portion 410. In some embodiments, the adhesive 320 may be disposed between the frame ring 400 and the frame ring 500, so that the frame ring 400 may remain exposed in correspondence of the protrusions P422 and P424. Other aspects of the semiconductor device SD20 may be the same as previously described for the semiconductor device SD10 (illustrated, e.g., in FIG. 3A).

It should be noted that while in the following the semiconductor devices will be illustrated with overhangs O500 and O420 configured as the frame rings 400 and 500 of FIG. 3D and FIG. 3E, the disclosure is not limited thereto. Embodiments corresponding to the configurations of FIG. 4A to FIG. 6B (e.g., without the overhang O500 and possibly with one or both of the protrusions P420/P422 and P424) may be realized for each one of the semiconductor devices disclosed herein, according to the warpage and stress control behavior desired for the frame rings.

Figure 7B:
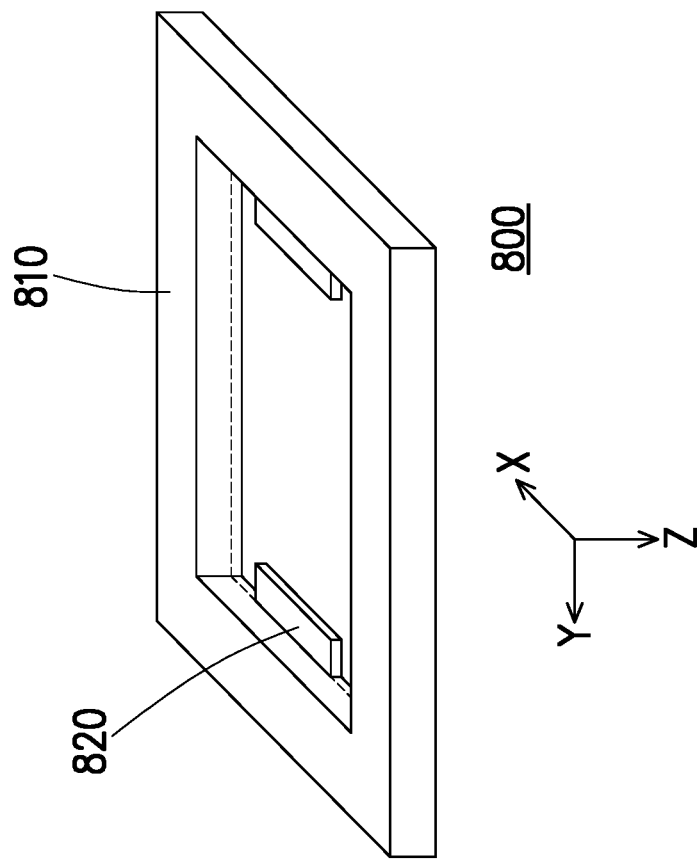
FIG. 7B is a schematic perspective view of a frame ring according to some embodiments of the disclosure.
Figure 7A:
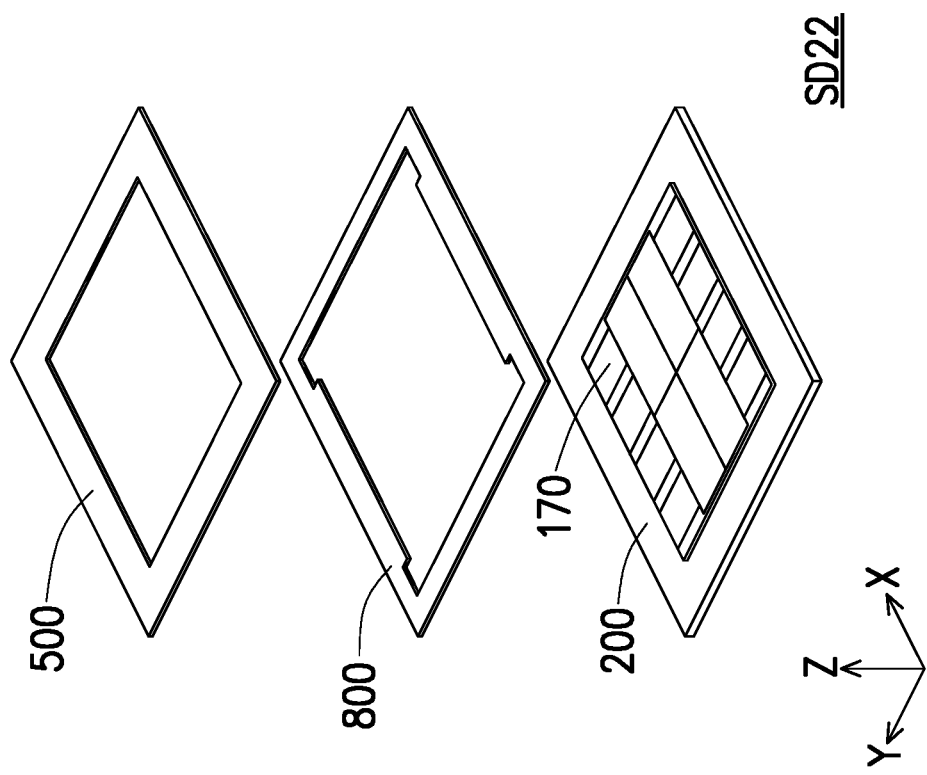
FIG. 7A is a schematic exploded view of a semiconductor device according to some embodiments of the disclosure.
Figure 7D:
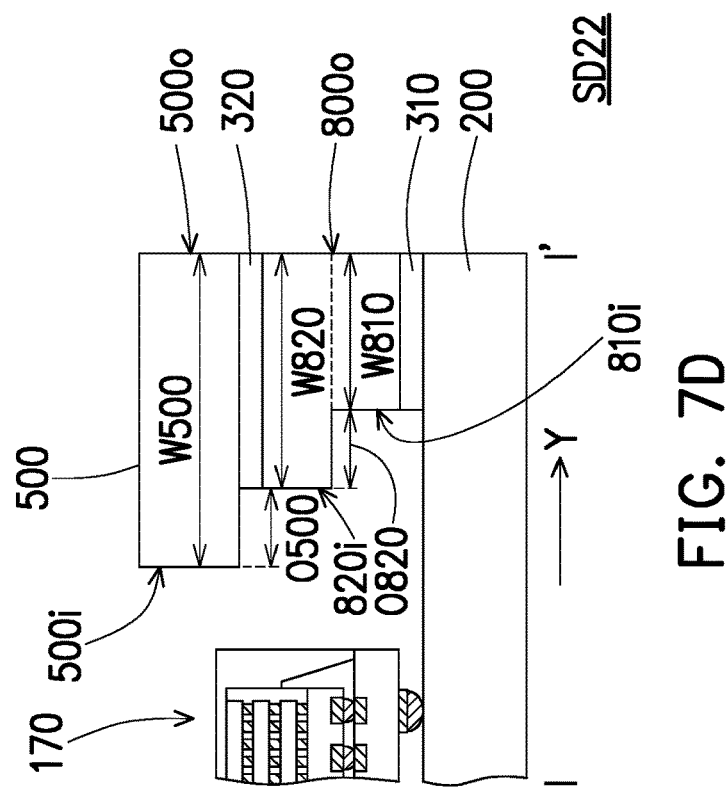
FIG. 7D to FIG. 7F are schematic cross-sectional views of regions of a semiconductor device according to some embodiments of the disclosure.
Figure 7C:
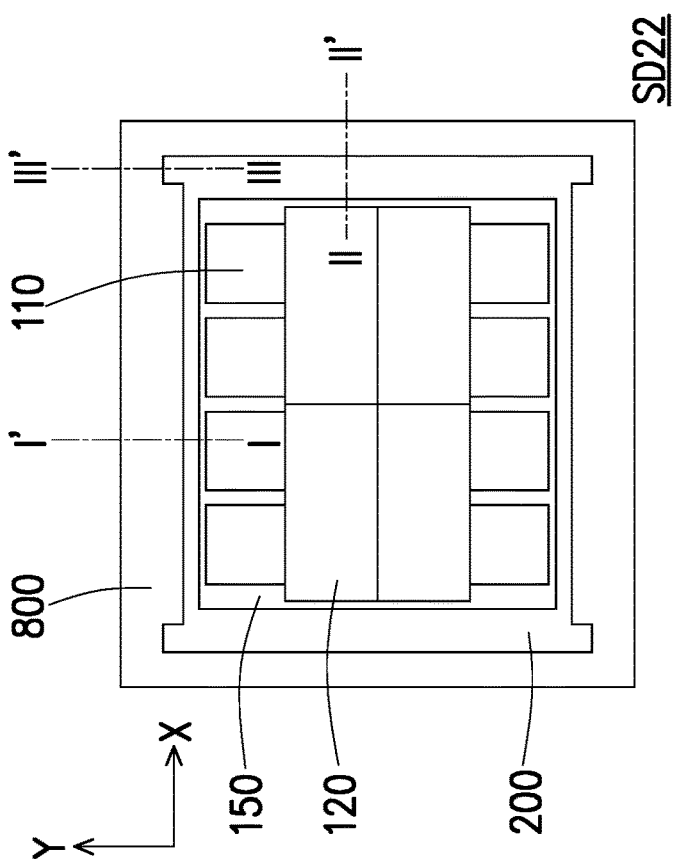
FIG. 7C is a schematic top view of a semiconductor device according to some embodiments of the disclosure.
Figure 7F:
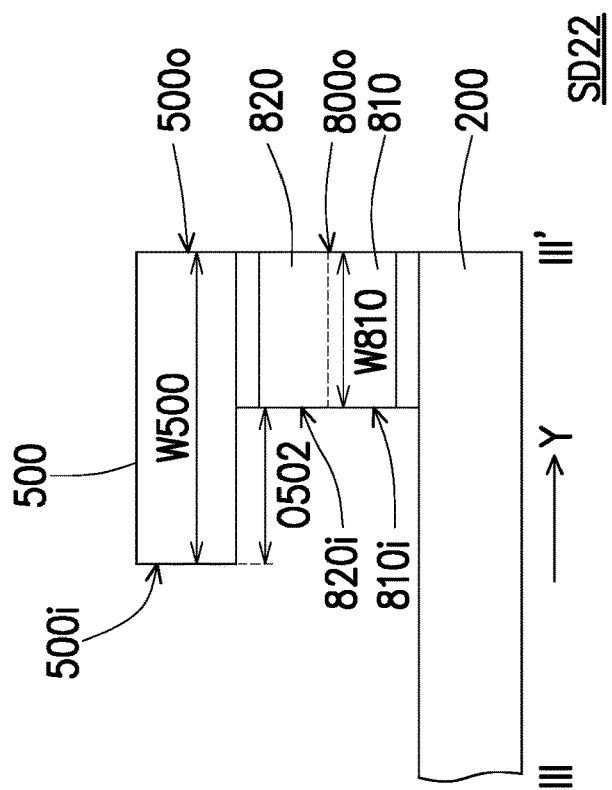
Figure 7E:
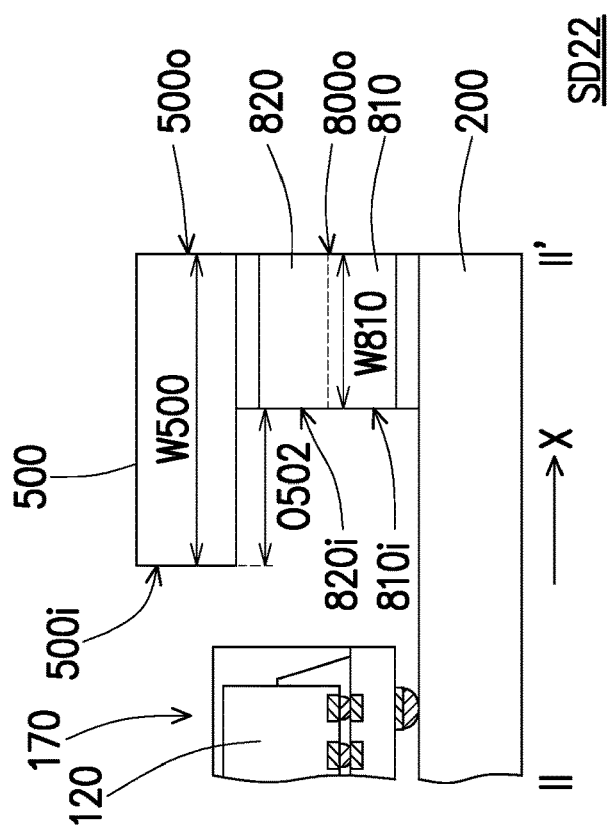

FIG. 7A is a schematic exploded view of a semiconductor device SD22 according to some embodiments of the disclosure. In some embodiments, the semiconductor device SD22 is identical to the semiconductor device SD10 but for including the frame ring 800 in place of the frame ring 400 (illustrated, e.g., in FIG. 3A). FIG. 7B is a schematic perspective view of the frame ring 800 according to some embodiments of the disclosure. FIG. 7B has a different orientation along the Z direction with respect to FIG. 7A, so that the bottom surface of the frame ring 800 is visible in FIG. 7B while the top surface of the frame ring 800 is visible in FIG. 7A. FIG. 7C is a schematic top view of the semiconductor device SD22 according to some embodiments of the disclosure. In the schematic top view of FIG. 7C, the frame ring 500 has been omitted for clarity of illustration. FIG. 7D to FIG. 7F are schematic cross-sectional views of regions of the semiconductor device SD22 respectively taken along the lines I-I', II-II', and III-III' illustrated in FIG. 7C. Referring to FIG. 7A to FIG. 7F, in the semiconductor device SD22 the frame ring 800 includes the base portion 810 and the overhang portion 820 protruding in at least one section towards the semiconductor package 170. A difference between the frame ring 400 and the frame ring 800 lies in that the overhang portion 820 includes the overhang O820 with respect to the base portion 810 along some (but not all) of the borders of the frame ring 800. For example, the overhang O820 is included protruding towards the semiconductor package along the Y direction at opposite borders of the overhang portion 820 extending along the X direction, while at the borders of the overhang portion 820 extending along the Y direction, no overhang is included. For example, at the level height of the line I-I', the overhang portion 820 of the frame ring 800 includes the overhang O820 with respect to the base portion 810, and the frame ring 500 includes the overhang O500 with respect to the overhang portion 820. That is, the width W500 of the frame ring 500 in correspondence of the line I-I' is greater than the width W820 of the overhang portion 820 in the same region, and the width W820 of the overhang portion 820 is greater than the width W810 of the base portion 810. As such, at the level of the line I-I' along the X direction, the inner edges 810i, 820i, and 500i are vertically misaligned with respect to each other. For example, the overhang O820 may be included so that the inner edge 820i protrudes when facing regions of the semiconductor package 170 where the smaller semiconductor dies 110 are located. On the other hand, at the level height of the line II-II', the overhang portion 820 may have the same width W810 as the base portion 810, so that the inner edges 810i and 820i may be vertically aligned with respect to each other. The frame ring 500, on the other hand, may have a greater width W500 (e.g., the same width W500 as along the line I-I') than the overhang portion 820 in correspondence of the line II-II', so that the frame ring 500 protrudes for the overhang O502 with respect to the overhang portion 820. The overhang O502 included at the level height of the line II-II' may be greater than the overhang O500 included at the level height of the line I-I'. For example, the frame ring 500 may protrude with the overhang O502 where the frame ring 500 faces regions of the semiconductor package 170 where the larger semiconductor dies 120 are located. Alternatively stated, the overhang O500 and the overhang O820 may be included along borders of the frame rings 800 and 500 extending along the X direction (so that the overhangs O820 and O500 protrude towards the semiconductor package 170 along the Y direction), while no overhang O820 may be included along the borders of the frame ring 800 extending along the Y direction, and so that the frame ring 500 includes the overhang O502 protruding along the X direction along the borders of the frame ring 500 extending along the Y direction. In some embodiments, the overhang O820 is included in correspondence of the semiconductor package 170, while regions of the overhang portion 820 not facing the semiconductor package 170 may have a smaller width (e.g., the width W810) so that no overhang O820 is included, as illustrated, e.g., in FIG. 7F for the region along the line III-III'. Such region, while belonging to a border of the frame ring 800 extending along the X direction (hence, a border where the overhang O820 is included in correspondence of the semiconductor package 170), may present the overhang O502 of the frame ring 500 with respect to the frame ring 800. That is, at the corners where the borders of the frame ring 800 extending along different directions (e.g., X and Y direction) are jointed, no overhang O820 may be included. In some embodiments, the adhesive 320 is disposed so as to reflect the width of the underlying overhang portion 820. Therefore, the adhesive 320 may present wider regions (along the X or Y direction) where the overhang O820 is included, and narrower regions where the overhang O502 is included.

Figure 8B:
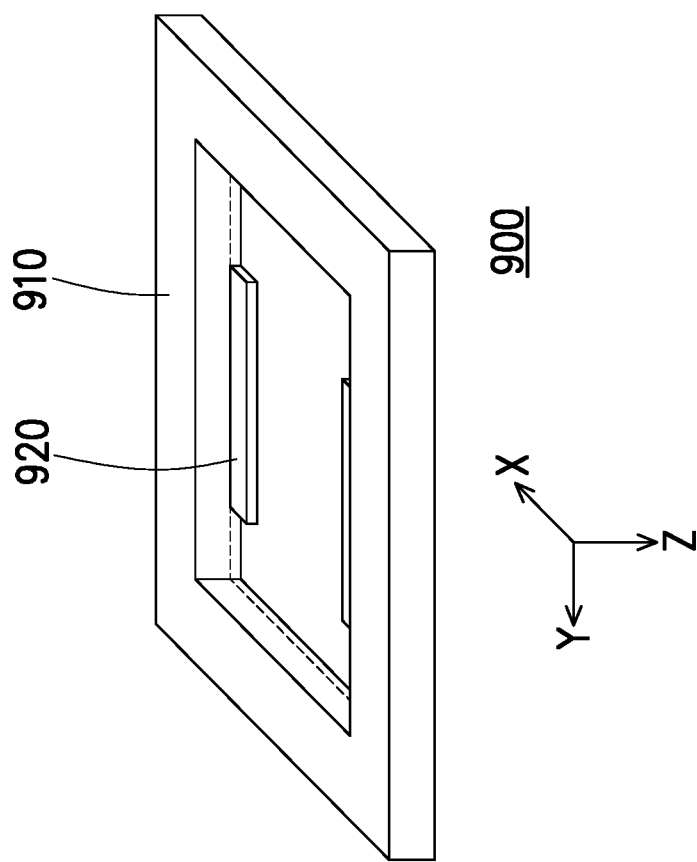
FIG. 8B is a schematic perspective view of a frame ring according to some embodiments of the disclosure.
Figure 8A:
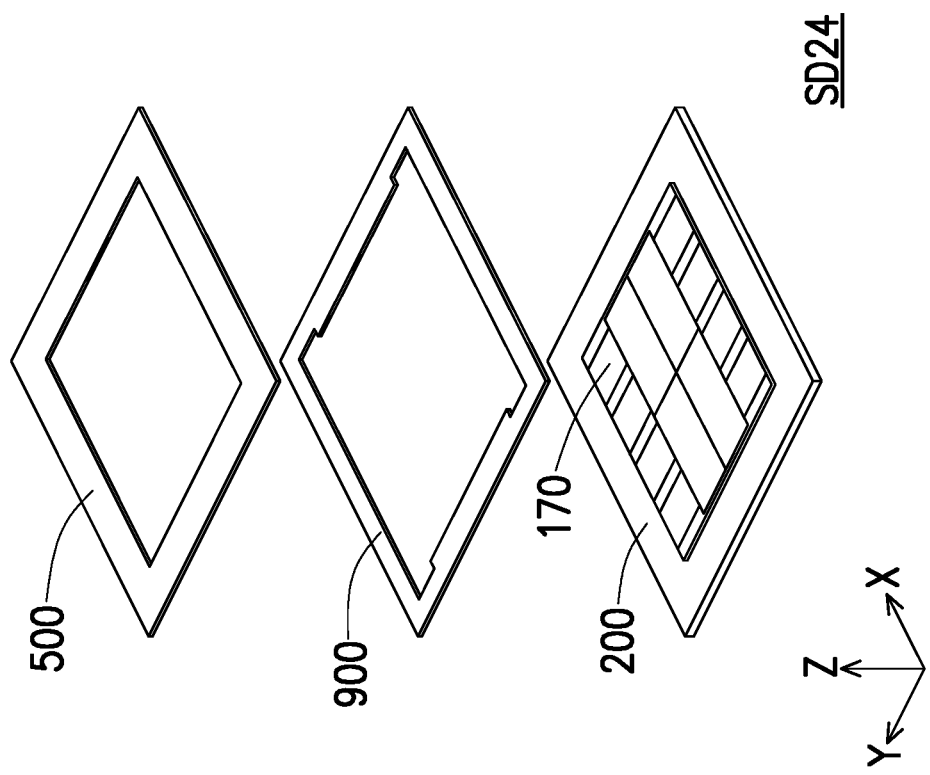
FIG. 8A is a schematic exploded view of a semiconductor device according to some embodiments of the disclosure.
Figure 8D:
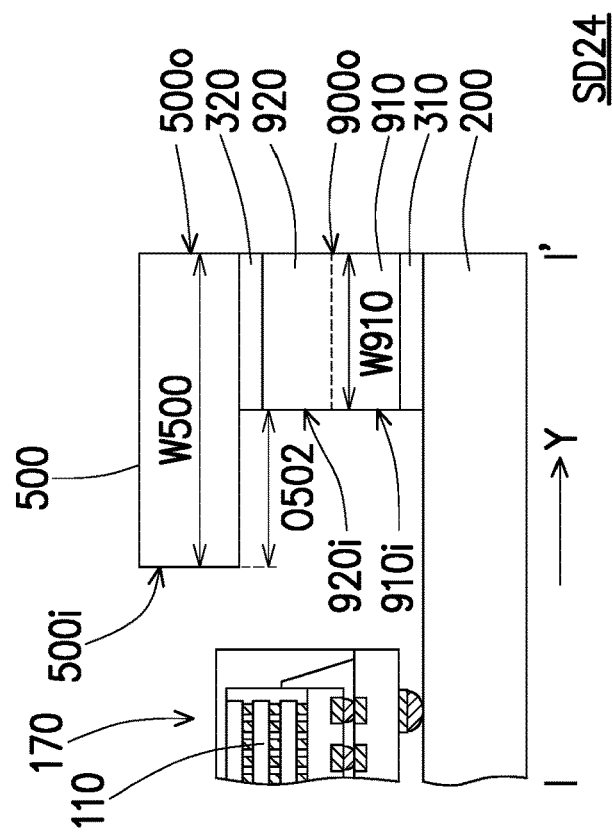
FIG. 8D to FIG. 8F are schematic cross-sectional views of regions of a semiconductor device according to some embodiments of the disclosure.
Figure 8C:
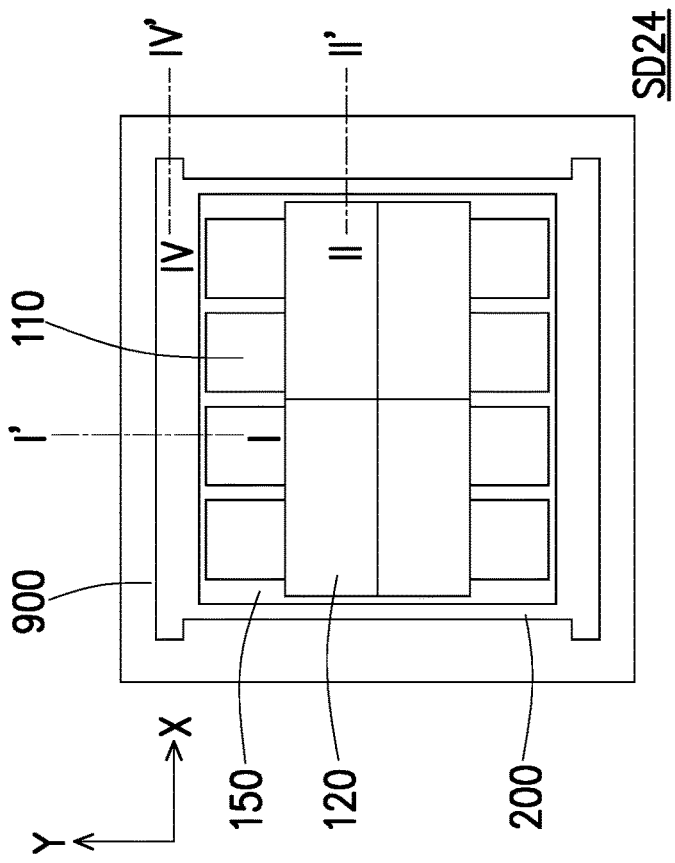
FIG. 8C is a schematic top view of a semiconductor device according to some embodiments of the disclosure.
Figure 8F:
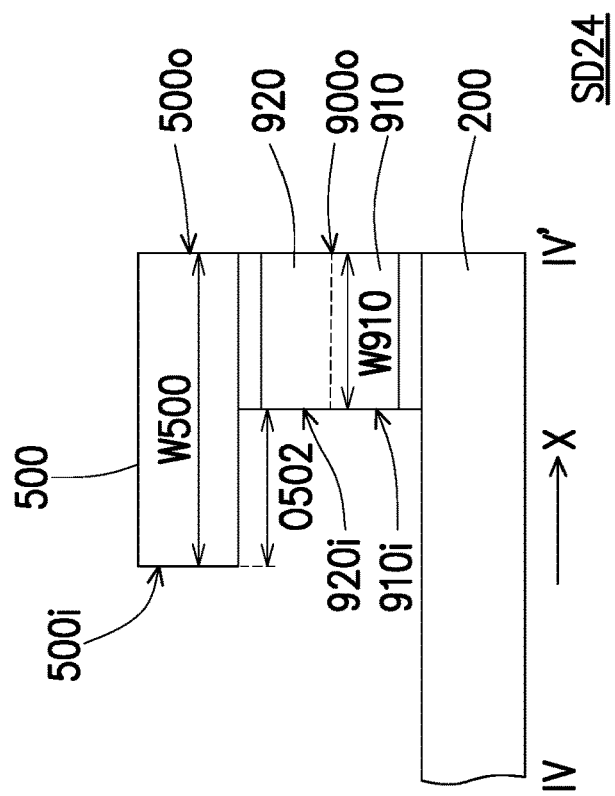
Figure 8E:
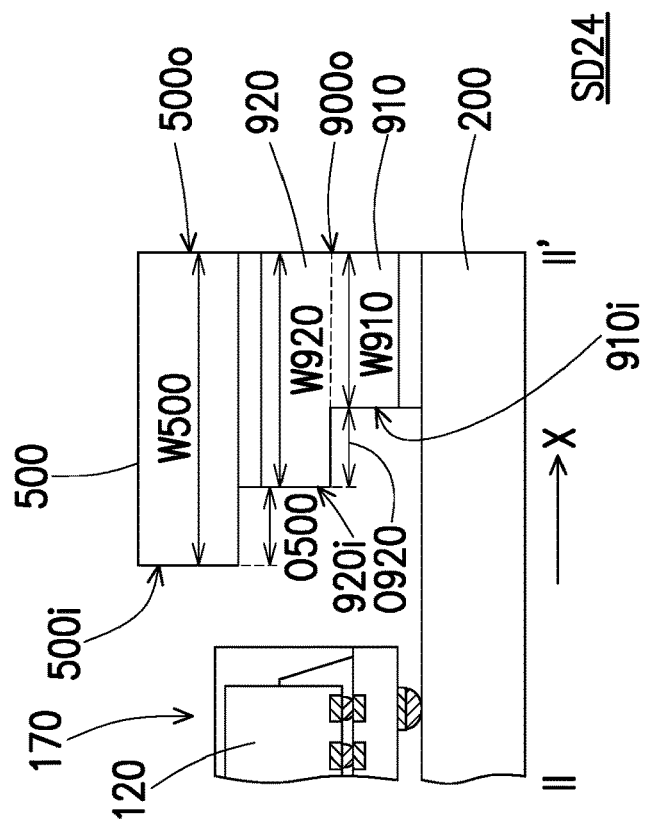

FIG. 8A is a schematic exploded view of a semiconductor device SD24 according to some embodiments of the disclosure. In some embodiments, the semiconductor device SD24 is identical to the semiconductor device SD10 but for including the frame ring 900 in place of the frame ring 400 (illustrated, e.g., in FIG. 3A). FIG. 8B is a schematic perspective view of the frame ring 900 according to some embodiments of the disclosure. FIG. 8B has a different orientation along the Z direction with respect to FIG. 8A, so that the bottom surface of the frame ring 900 is visible in FIG. 8B while the top surface of the frame ring 900 is visible in FIG. 8A. FIG. 8C is a schematic top view of the semiconductor device SD24 according to some embodiments of the disclosure. In the schematic top view of FIG. 8C, the frame ring 500 has been omitted for clarity of illustration. FIG. 8D to FIG. 8F are schematic cross-sectional views of regions of the semiconductor device SD24 respectively taken along the lines I-I', II-II', and IV-IV' illustrated in FIG. 8C. Referring to FIG. 8A to FIG. 8F, in the semiconductor device SD24 the frame ring 900 includes the base portion 910 and the overhang portion 920 protruding towards the semiconductor package 170. A difference between the frame ring 400 and the frame ring 900 lies in that the overhang portion 920 includes the overhang O920 with respect to the base portion 910 along some (but not all) of the borders of the base portion 910. For example, the overhang O920 is included protruding towards the semiconductor package 170 along the X direction at opposite borders of the overhang portion O920 extending along the Y direction, while at the borders of the overhang portion 820 extending along the X direction, no overhang is included. For example, at the level height of the line II-II', the overhang portion 920 of the frame ring 900 has the overhang O920 with respect to the base portion 910, and the frame ring 500 has the overhang O500 with respect to the overhang portion 920. That is, the width W500 of the frame ring 500 in correspondence of the line II-II' is greater than the width W920 of the overhang portion 920 in the same region, and the width W920 of the overhang portion 920 is greater than the width W910 of the base portion 910. As such, at the level of the line II-II' along the Y direction, the inner edges 910i, 920i, and 500i are vertically misaligned with respect to each other. For example, the overhang O920 may be included so that the frame ring 900 protrudes when facing regions of the semiconductor package 170 where the larger semiconductor dies 120 are located. On the other hand, at the level height of the line I-I', the overhang portion 920 may have the same width W910 as the base portion 910, so that the inner edges 910i and 920i may be vertically aligned with respect to each other. The frame ring 500, on the other hand, may have a greater width W500 (e.g., the same width W500 as along the line II-II') than the overhang portion 920, so that the frame ring 500 protrudes for the overhang O502 with respect to the overhang portion 920. The overhang O502 included at the level height of the line I-I' may be greater than the overhang O500 included at the level height of the line II-II'. For example, the frame ring 500 may protrude with the overhang O502 where the frame ring 500 faces regions of the semiconductor package 170 where the smaller semiconductor dies 110 are located. Alternatively stated, the overhang O500 and the overhang O920 may be included along borders of the frame rings 900 and 500 extending along the Y direction (so that the overhangs O920 and O500 protrude towards the semiconductor package 170 along the X direction), while no overhang O920 may be included along the borders of the frame ring 900 extending along the X direction, and so that the frame ring 500 has the overhang O502 along the borders of the frame ring 500 extending along the X direction. In some embodiments, the overhang O920 is included in correspondence of the semiconductor package 170, while regions of the overhang portion 920 not facing the semiconductor package 170 may present a smaller width (e.g., the width W910) so that no overhang O920 is included, as illustrated, e.g., in FIG. 8F for the region along the line IV-IV'. Such region, while belonging to a border of the frame ring 900 extending along the Y direction (hence, a border where the overhang O920 is included in correspondence of the semiconductor package 170), may present the overhang O502 of the frame ring 500 with respect to the frame ring 900. That is, at the corners where the borders of the frame ring 900 extending along different directions (e.g., X and Y direction) are jointed, no overhang O920 may be included. In some embodiments, the adhesive 320 is disposed so as to reflect the width of the underlying overhang portion 920. So, the adhesive 320 may present wider regions (along the X or Y direction) where the overhang O920 is included, and narrower regions where the overhang O502 is included.

Figure 9B:
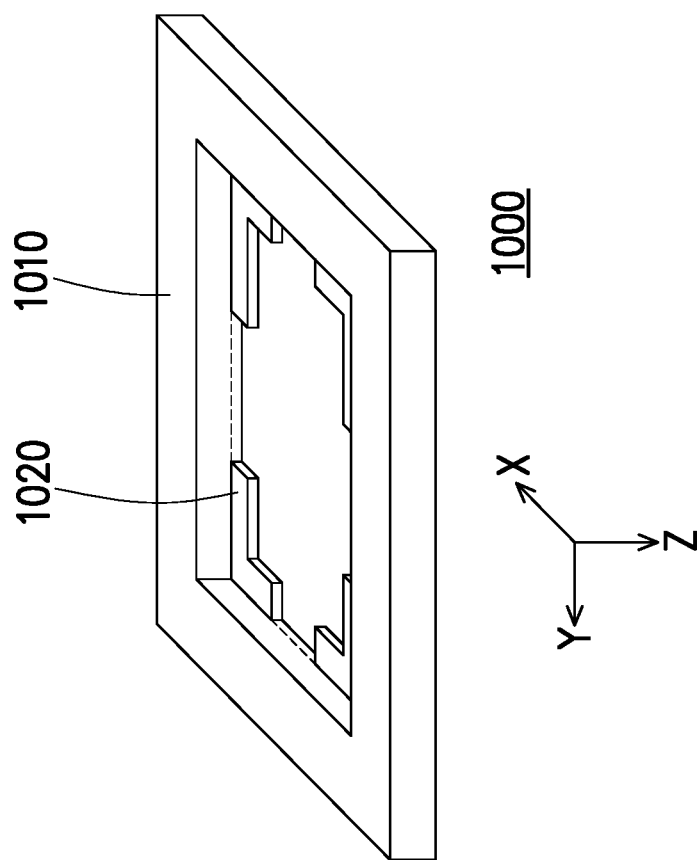
FIG. 9B is a schematic perspective view of a frame ring according to some embodiments of the disclosure.
Figure 9A:
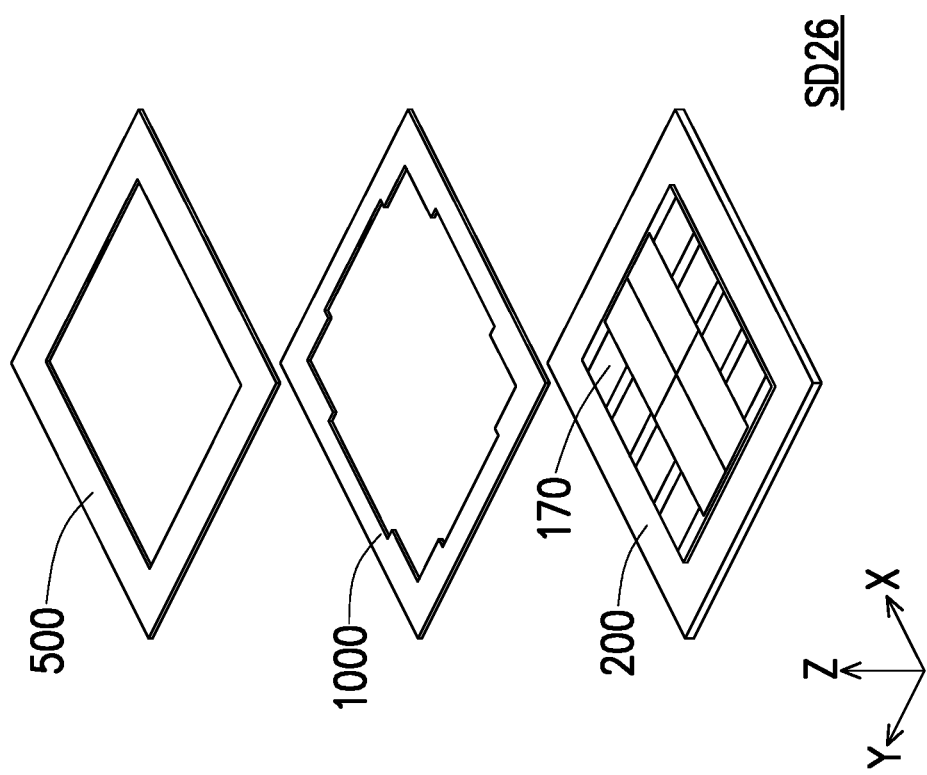
FIG. 9A is a schematic exploded view of a semiconductor device according to some embodiments of the disclosure.
Figure 9D:
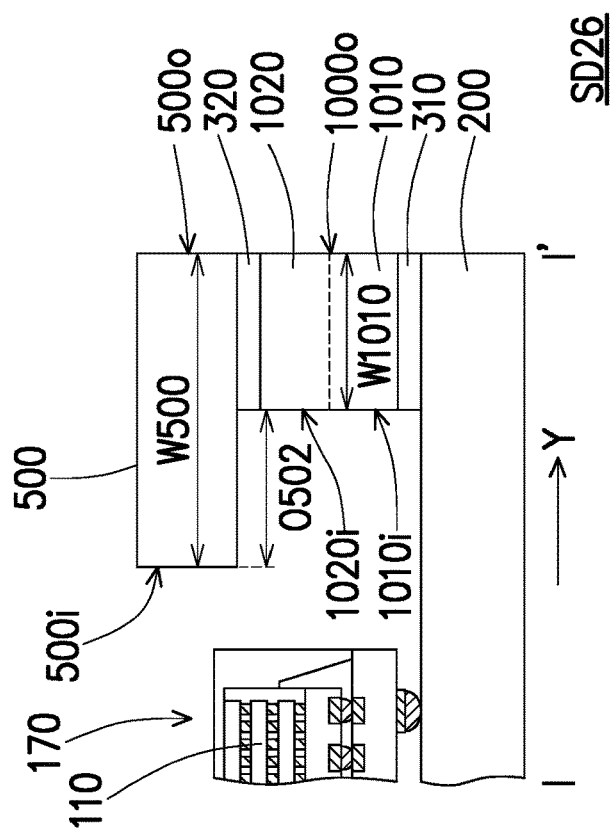
Figure 9C:
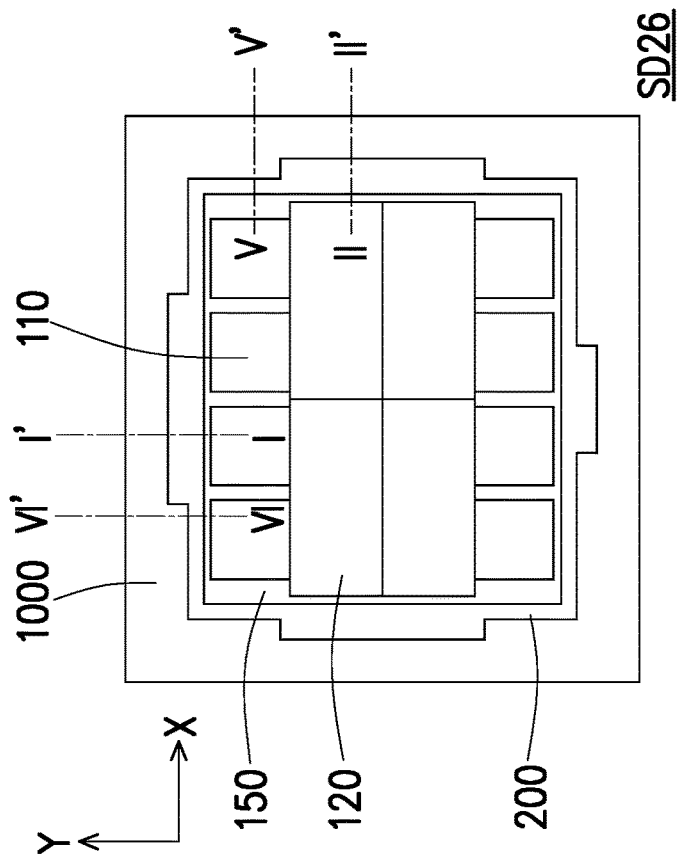
FIG. 9C is a schematic top view of a semiconductor device according to some embodiments of the disclosure.

FIG. 9A is a schematic exploded view of a semiconductor device SD26 according to some embodiments of the disclosure. In some embodiments, the semiconductor device SD26 is identical to the semiconductor device SD10 but for including the frame ring 1000 in place of the frame ring 400 (illustrated, e.g., in FIG. 3A). FIG. 9B is a schematic perspective view of the frame ring 1000 according to some embodiments of the disclosure. FIG. 9B has a different orientation along the Z direction with respect to FIG. 9A, so that the bottom surface of the frame ring 1000 is visible in FIG. 9B while the top surface of the frame ring 1000 is visible in FIG. 9A. FIG. 9C is a schematic top view of the semiconductor device SD26 according to some embodiments of the disclosure. In the schematic top view of FIG. 9C, the frame ring 500 has been omitted for clarity of illustration. FIG. 9D to FIG. 9F are schematic cross-sectional views of regions of the semiconductor device SD26 respectively taken along the lines I-I', II-II', and (jointly) V-V' and VI-VI' illustrated in FIG. 9C. Referring to FIG. 9A to FIG. 9F, in the semiconductor device SD26 the frame ring 1000 includes the base portion 1010 and the overhang portion 1020 protruding towards the semiconductor package 170 in correspondence of the corners of the frame ring 1000. That is, a difference between the frame ring 400 and the frame ring 1000 lies in that the overhang portion 1020 includes the overhang O1020 with respect to the base portion 1010 in regions facing the corners of the semiconductor package 170 rather than all along the borders of the frame ring 1000 in some embodiments. For example, the overhang O1020 is included protruding towards the semiconductor package 170 along the X and Y directions where adjacent borders of the overhang portion O1020 joint, while along central regions of the borders of the overhang portion 1020 no overhang is included. For example, at the level height of the lines V-V' and VI-VI', the overhang portion 1020 of the frame ring 1000 has the overhang O1020 with respect to the base portion 1010, and the frame ring 500 has the overhang O500 with respect to the overhang portion 1020. That is, the width W500 of the frame ring 500 in correspondence of the line V-V' or VI-VI' is greater than the width W1020 of the overhang portion 1020 in the same region, and the width W1020 of the overhang portion 1020 is greater than the width W1010 of the base portion 1010. As such, at the level of the line V-V' along the Y direction and the line VI-VI' along the X direction, the inner edges 1010i, 1020i, and 500i are vertically misaligned with respect to each other. For example, the overhang O1020 may be included so that the frame ring 1000 protrudes when facing corner regions of the semiconductor package 170 where the smaller semiconductor dies 120 are located. On the other hand, at the level height of the lines I-I' and II-II', the overhang portion 1020 may have the same width W1010 as the base portion 1010, so that the inner edges 1010i and 1020i of the frame ring 1000 may be vertically aligned with respect to each other. The frame ring 500, on the other hand, may have a greater width W500 (e.g., the same width W500 as along the line V-V' or VI-VI') than the overhang portion 1020, so that the frame ring 500 protrudes for the overhang O502 with respect to the overhang portion 1020. The overhang O502 included at the level height of the line I-I' or II-II' may be greater than the overhang O500 included at the level height of the line V-V' or VI-VI'. For example, the frame ring 500 may protrude with the overhang O502 where the frame ring 500 faces central regions of the semiconductor package 170 where the smaller semiconductor dies 110 or the larger semiconductor dies 120 are located. Alternatively stated, the overhang O500 and the overhang O1020 may be included at the joints of the borders of the frame rings 1000 and 500, while no overhang O1020 may be included along the central regions of the borders of the frame ring 1000, where, instead, the overhang O502 is included. In some embodiments, the adhesive 320 is disposed so as to reflect the width of the underlying overhang portion 1020. So, the adhesive 320 may present wider regions (along the X or Y direction) where the overhang O1020 is included, and narrower regions where the overhang O502 is included.

Figure 10B:
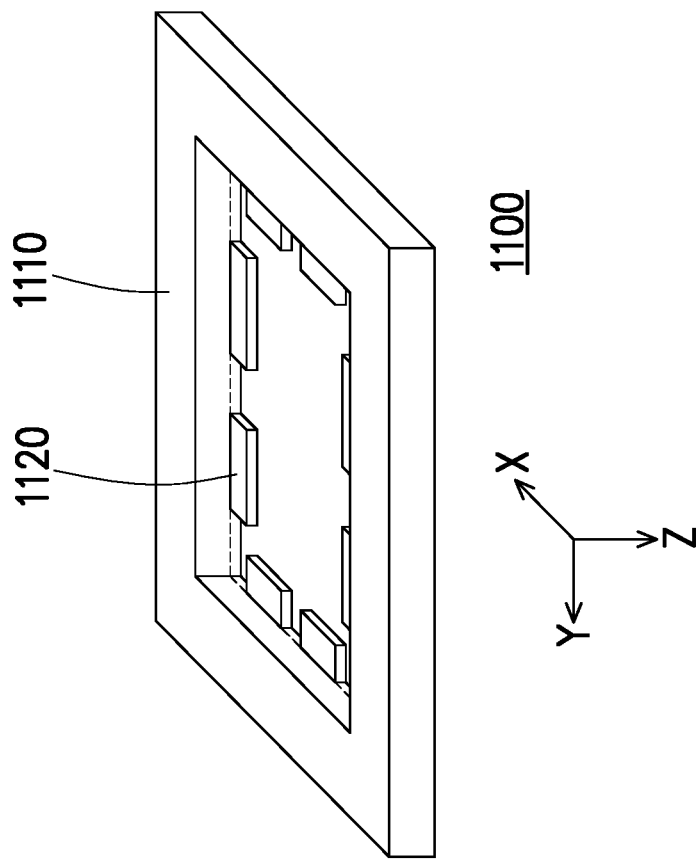
FIG. 10B is a schematic perspective view of a frame ring according to some embodiments of the disclosure.
Figure 10A:
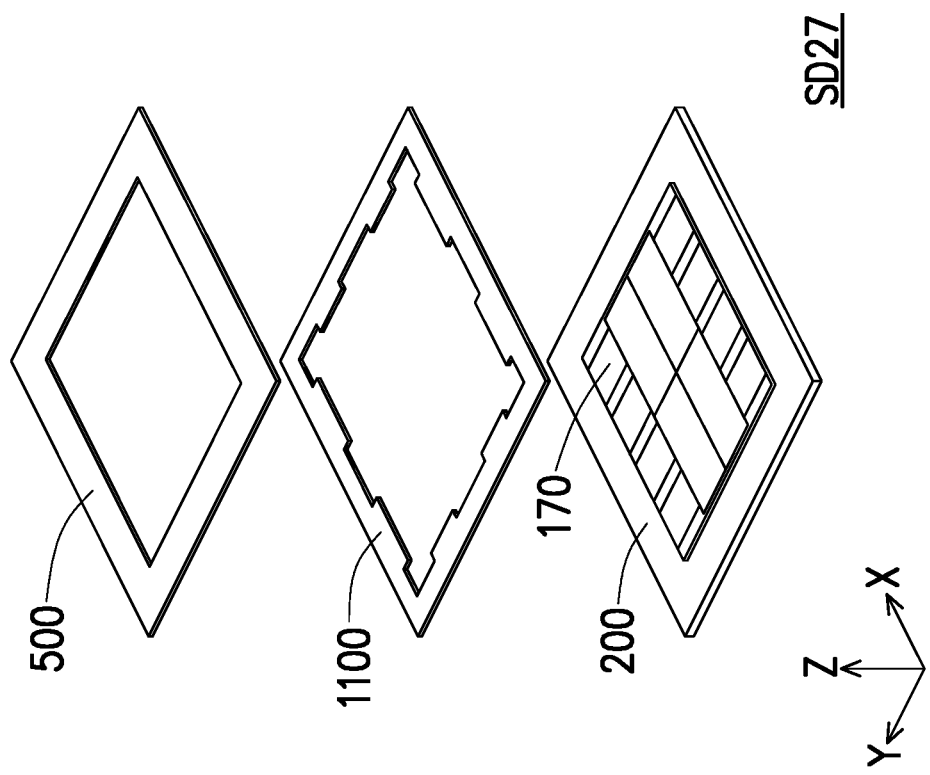
FIG. 10A is a schematic exploded view of a semiconductor device according to some embodiments of the disclosure.
Figure 10D:
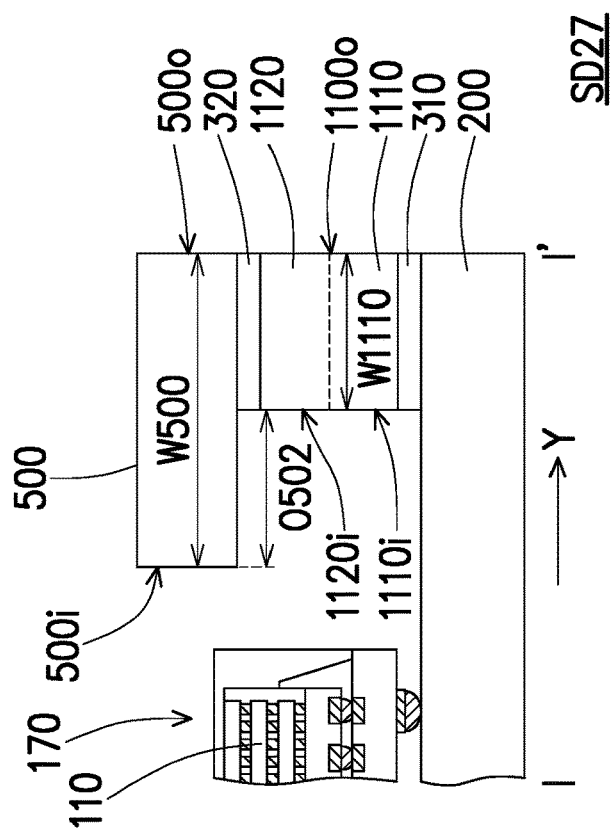
FIG. 10D to FIG. 10H are schematic cross-sectional views of regions of a semiconductor device according to some embodiments of the disclosure.
Figure 10C:
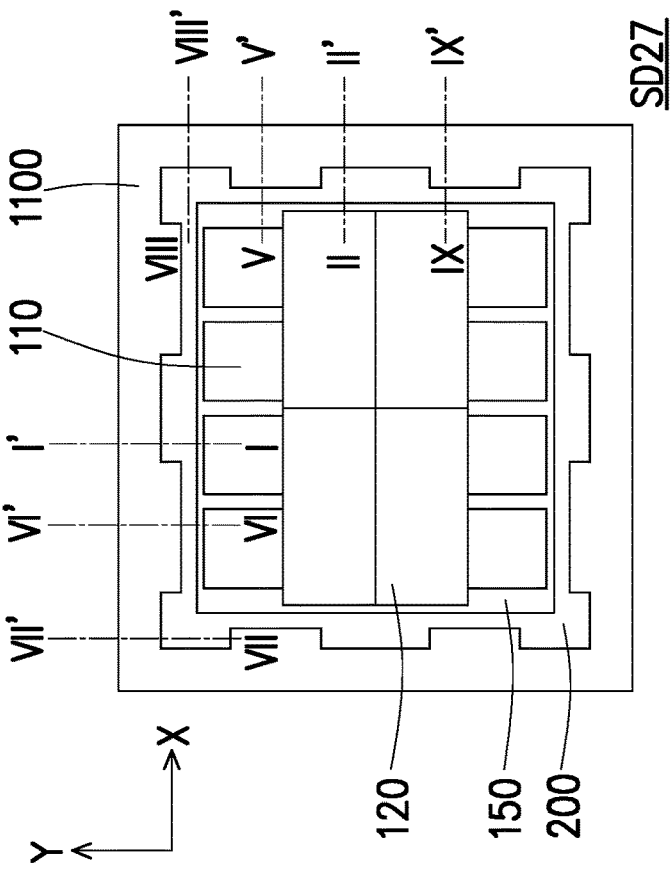
FIG. 10C is a schematic top view of a semiconductor device according to some embodiments of the disclosure.
Figure 10F:
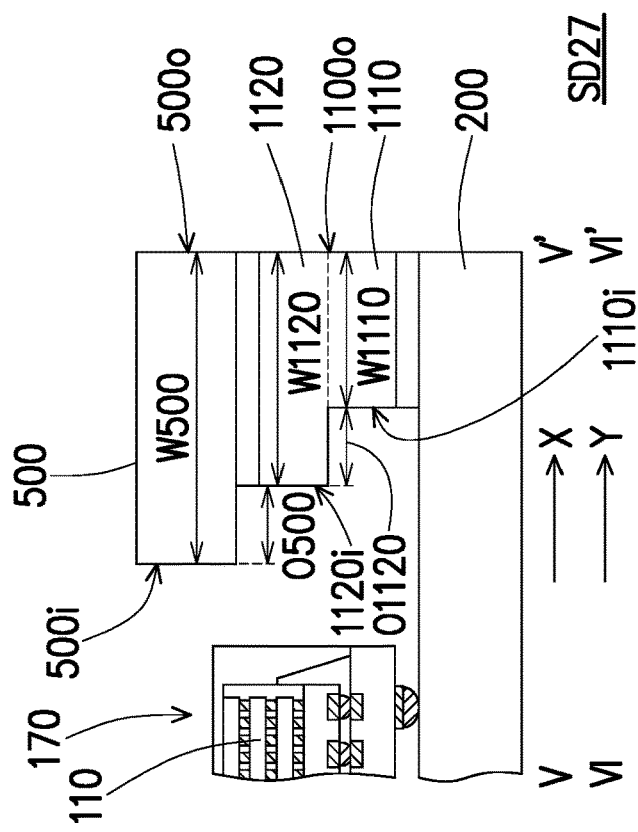
Figure 10E:
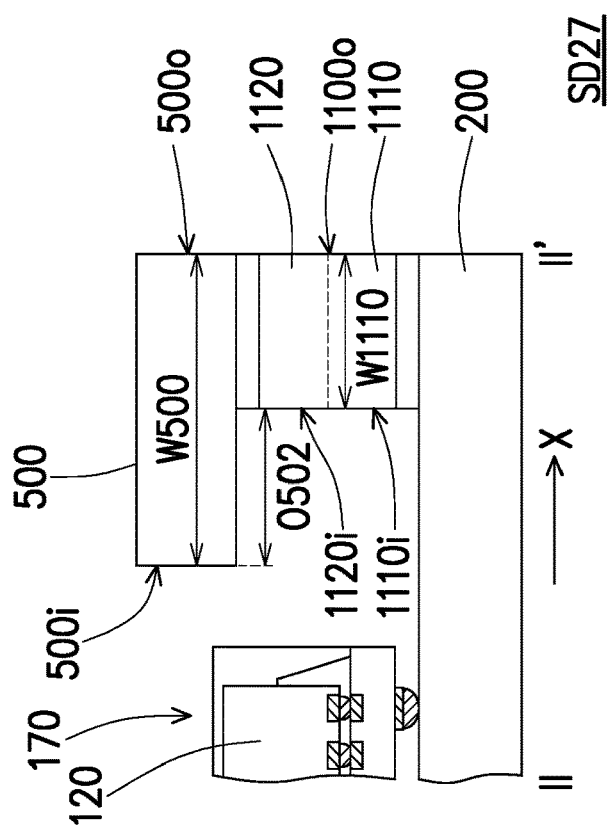
Figure 10H:
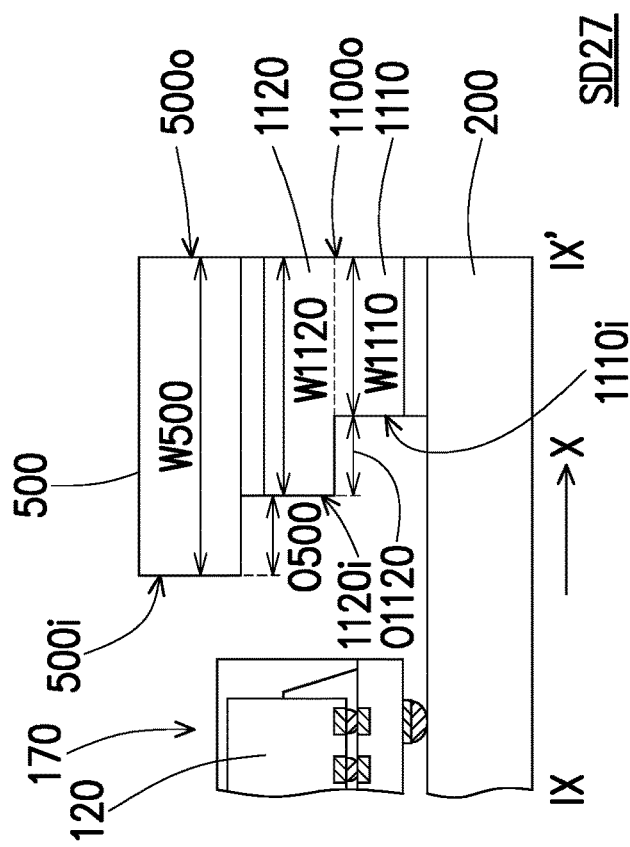
Figure 10G:
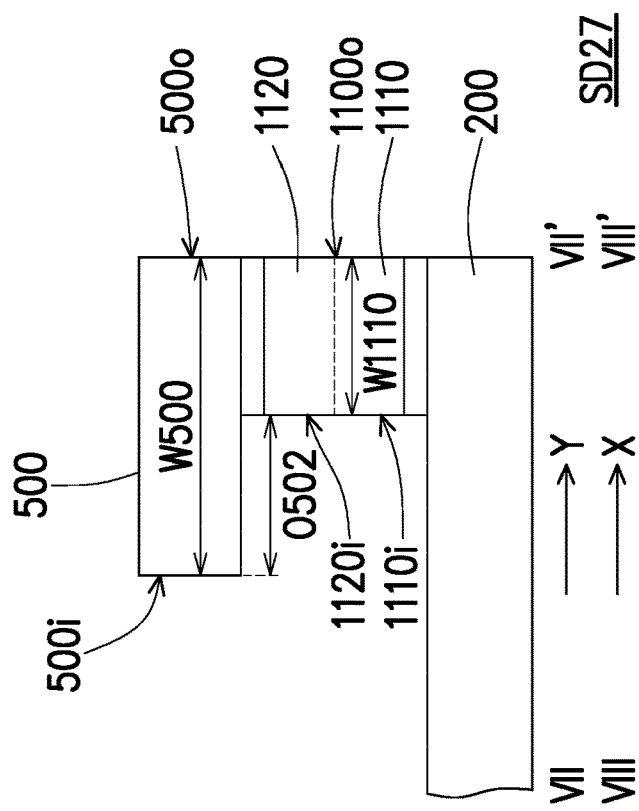

FIG. 10A is a schematic exploded view of a semiconductor device SD27 according to some embodiments of the disclosure. In some embodiments, the semiconductor device SD27 is identical to the semiconductor device SD10 but for including the frame ring 1100 in place of the frame ring 400 (illustrated, e.g., in FIG. 3A). FIG. 10B is a schematic perspective view of the frame ring 1100 according to some embodiments of the disclosure. FIG. 10B has a different orientation along the Z direction with respect to FIG. 10A, so that the bottom surface of the frame ring 1100 is visible in FIG. 10B while the top surface of the frame ring 1100 is visible in FIG. 10A. Figure is a schematic top view of the semiconductor device SD27 according to some embodiments of the disclosure. In the schematic top view of FIG. 10C, the frame ring 500 has been omitted for clarity of illustration. FIG. 10D to FIG. 10H are schematic cross-sectional views of regions of the semiconductor device SD26 respectively taken along the lines I-I', II-II', (jointly) V-V' and VI-VI', (jointly) VII-VII' and VIII-VIII', and IX-IX' illustrated in FIG. 10C. Referring to FIG. 10A to FIG. 10H, in the semiconductor device SD27 the frame ring 1100 includes the base portion 1110 and the overhang portion 1120, where the overhang portion 1120 protrudes with respect to the base portion 1110 to include indented overhangs O1120 along the borders of the frame ring 1100. That is, a difference between the frame ring 400 and the frame ring 1100 lies in that the overhang portion 1120 has multiple separate overhangs O1120 with respect to the base portion 1110 along the borders of the frame ring 1100. For example, the overhang O1120 is included protruding towards the semiconductor package 170 along the X and Y directions in separate regions of the borders of the frame ring 1100, while at the corners (e.g., the joints of the borders) of the overhang portion 1120 no overhang is included. For example, at the level height of the lines V-V' and VI-VI', the overhang portion 1120 has the overhang O1120 with respect to the base portion 1110, and the frame ring 500 has the overhang O500 with respect to the overhang portion 1120. That is, the width W500 of the frame ring 500 in correspondence of the line V-V' or VI-VI' is greater than the width W1120 of the overhang portion 1120 in the same region, and the width W1120 of the overhang portion 1120 is greater than the width W1110 of the base portion 1110. As such, at the level of the line V-V' along the Y direction and the line VI-VI' along the X direction, the inner edges 1110i, 1120i, and 500i are vertically misaligned with respect to each other. Similarly, overhangs O1120 protruding along the X direction may be included at the levels of the line IX-IX' along the Y direction. In some embodiments, the overhangs O1120 may be included so that the frame ring 1100 discontinuously protrudes while facing regions of the semiconductor package 170 where the semiconductor dies 110 and/or 120 are located. On the other hand, at the level height of the lines I-I', II-II', VII-VII' and VIII-VIII', the overhang portion 1120 may have the same width W1110 as the base portion 1110, so that the inner edges 1110*i* and 1120*i* may be vertically aligned with respect to each other. The frame ring 500, on the other hand, may have a greater width W500 (e.g., the same width W500 as along the line V-V' or VI-VI') than the overhang portion 1120, so that the frame ring 500 protrudes for the overhang O502 with respect to the overhang portion 1120. The overhang O502 included at the level height of the line I-I', II-II', VII-VII', or VIII-VIII' may be greater than the overhang O500 included at the level height of the line V-V', VI-VI', or IX-IX'. For example, regions where the frame ring 500 protrudes with the overhang O502 and the overhang O1120 is not included may alternate with regions where the frame ring 500 protrudes with the overhang O500 and the overhang O1120 is included. Alternatively stated, the overhang O1120 may be included as a plurality of indentation along the borders of the frame ring 1100. In some embodiments, the adhesive 320 is disposed so as to reflect the width of the underlying overhang portion 1120. So, the adhesive 320 may present wider regions (along the X or Y direction) where the overhang O1120 is included, and narrower regions where the overhang O502 is included.

Figure 11:
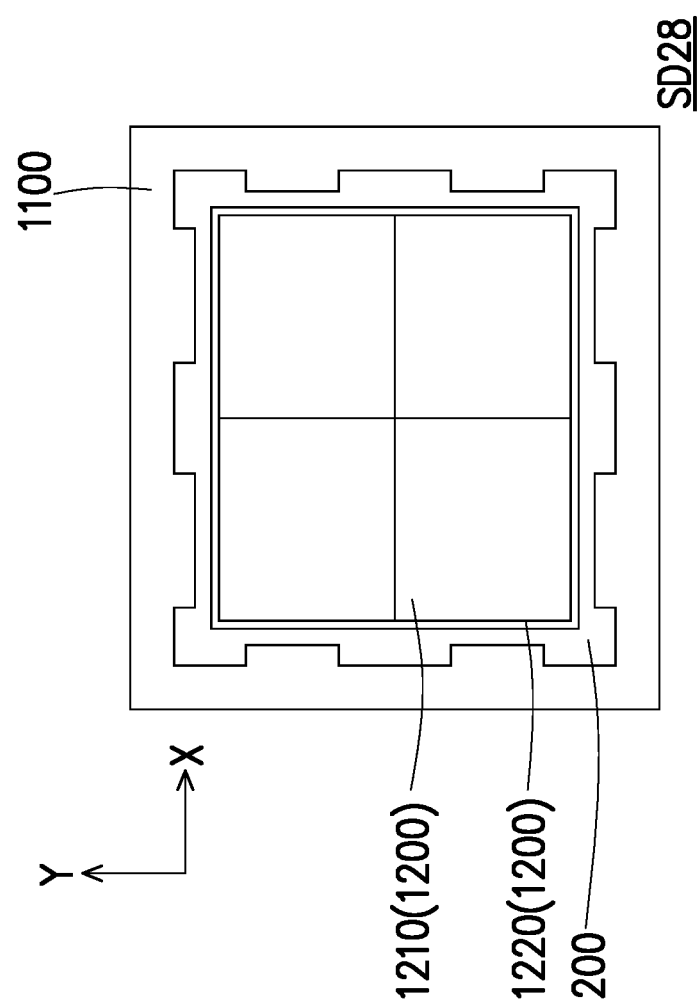
FIG. 11 is a schematic top view of a semiconductor device according to some embodiments of the disclosure.

In some embodiments, the number, type, and positions of the overhangs for the lower frame ring (e.g., the frame ring 400 in FIG. 3A) may be selected according to the expected warpage and underfill stress of the semiconductor device, for example as a function of the structure of the semiconductor package connected to the circuit substrate 200. As a way of example and not of limitation, the frame ring 1100 of FIG. 10A may be used in the semiconductor device SD28 illustrated in FIG. 11. The semiconductor device SD28 may be identical to the semiconductor device SD27 of FIG. 10A but for including the semiconductor package 1200 in place of the semiconductor package 170 of FIG. 10A. In some embodiments, the semiconductor package 1200 may still be a chip-on-wafer package such as the semiconductor package 170, differing from the semiconductor package 170 for the type and number of semiconductor dies included. For example, the semiconductor package 1200 may include four larger semiconductor dies 1210 disposed in a square configuration and encapsulated by the encapsulant 1220. Generally speaking, the semiconductor package 1200 may be expected to result in a different warpage behavior for the circuit substrate 200 with respect to the semiconductor package 170, and the frame ring 1100 may be selected over other frame rings (such as, but not limited to, the frame ring 400 of FIG. 3A, the frame ring 800 of FIG. 7A, the frame ring 900 of FIG. 8A, or the frame ring 1000 of FIG. 10A) taking into account the expected compensation of the warpage of the circuit substrate 200 as well as the stress experienced at the level of the underfill of the semiconductor package 1200 (e.g., the underfill 140 of FIG. 1I).

Furthermore, while in FIG. 7A to FIG. 11H the frame ring 500 has been illustrated as having the overhangs O500 or O502 with respect to the underlying frame rings (e.g. the frame rings 400, 800, 900, 1000, or 1100), the disclosure is not limited thereto, and the configurations previously discussed with respect to FIG. 5A to FIG. 6B (e.g., the underlying frame ring protruding from one or both sides of the frame ring 500, the outer edges being misaligned, etc.) may also be adopted in some embodiments of the invention.

Figure 12:
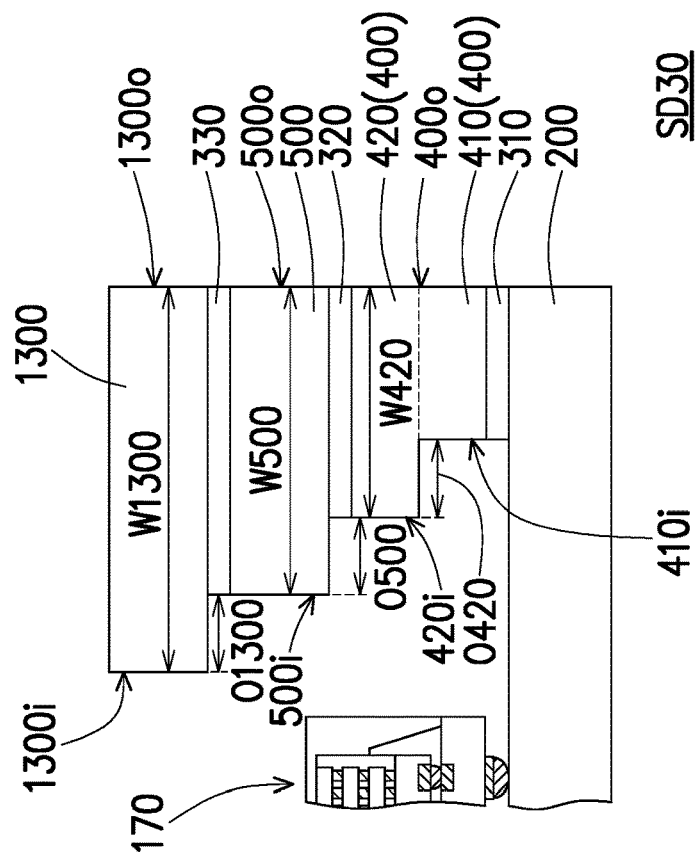

FIG. 12 is a schematic cross-sectional view of a region of a semiconductor device SD30 according to some embodiments of the disclosure. In some embodiments, the semiconductor device SD30 may have a similar structure and be manufactured according to a similar process to the semiconductor device SD10 of FIG. 3A. In some embodiments, the view of FIG. 12 is taken along a region corresponding to the region of the semiconductor device SD10 illustrated in FIG. 3D, but the disclosure is not limited thereto, and the configuration illustrated in FIG. 12 may be encountered along different regions of the semiconductor device SD30. In some embodiments, the semiconductor device SD30 further includes the frame ring 1300 stacked on the frame ring 500, possibly via the adhesive 330. A material of the frame ring 1300 may be selected from materials listed above for the frame rings 400 and 500. In some embodiments, the frame ring 1300 includes a different material than one or both of the underling frame rings 400 and 500. In some embodiments, the width W1300 of the frame ring 1300 is larger than the width W500 of the frame ring 500, so that the frame ring 1300 has the overhang O1300 with respect to the frame ring 500. The frame ring 500 may still have the overhang O500 with respect to the overhang portion 420 of the frame ring 400, and the overhang portion 420 may still have the overhang O420 with respect to the base portion 410. In some embodiments, the outer edges 1300*o*, 500*o*, and 400*o* of the frame rings 1300, 500, and 400 may be vertically aligned with respect to each other, while the inner edges 1300*i*, 500*i*, 420*i*, and 410*i* may be misaligned with respect to each other. In particular, the inner edge 1300*i* may further protrude towards the semiconductor package 170 with respect to the other inner edges 500*i*, 420*i*, 410*i*, the inner edge 500*i* may further protrude towards the semiconductor package 170 with respect to the inner edges 420*i*, 410*i*, and the inner edge 420*i* may further protrude towards the semiconductor package 170 with respect to the inner edge 410*i*. Other aspects of the semiconductor device SD30 may be the same as previously described for the semiconductor device SD10 (illustrated, e.g., in FIG. 3A).

Figure 13:
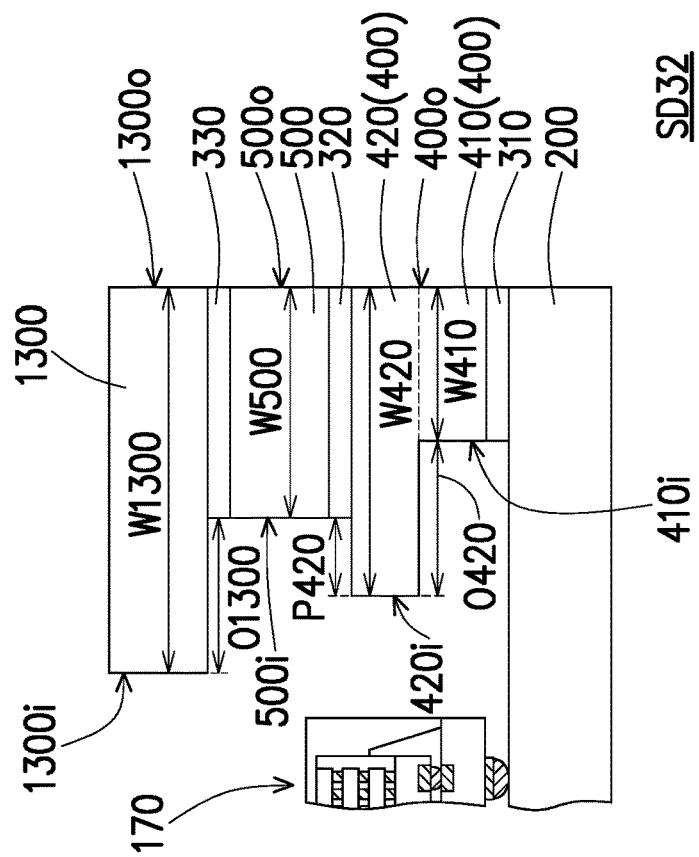
FIG. 12 to FIG. 17 are schematic cross-sectional views of regions of semiconductor devices according to some embodiments of the disclosure.

FIG. 13 is a schematic cross-sectional view of a region of a semiconductor device SD32 according to some embodiments of the disclosure. In some embodiments, the semiconductor device SD32 may have a similar structure and be manufactured according to a similar process to the semiconductor device SD30 of FIG. 12. In some embodiments, the view of FIG. 13 is taken along a region corresponding to the region of the semiconductor device SD30 illustrated in FIG. 12, but the disclosure is not limited thereto, and the configuration illustrated in FIG. 13 may be encountered along different regions of the semiconductor device SD32. In some embodiments, in the semiconductor device SD32, the width W500 of the frame ring 500 is smaller than the width W420 of the overhang portion 420 of the frame ring 400 and is also smaller than the width W1300 of the frame ring 1300. For example, the outer edge 500*o* of the frame ring 500 may still be vertically aligned with the outer edges 400*o* of the frame ring 400 and 1300*o* of the frame ring 1300, while the inner edge 420*i* of the overhang portion 420 may protrude with respect to both of the inner edge 500*i* of the frame ring 500 and the inner edge 410*i* of the base portion 410. The inner edge 1300*i* of the frame ring 1300 may protrude with respect to the inner edges 500*i*, 420*i*, 410*i* of the other frame rings 400 and 500. That is, in the semiconductor device SD32, the frame ring 1300 may include the overhang O1300 with respect to the frame ring 500, and the overhang portion 420 may include the overhang O420 with respect to the base portion 410 and the protrusion P420 with respect to the frame ring 500. In some embodiments, the adhesive 320 may be disposed between the frame ring 400 and the frame ring 500, so that the frame ring 400 may remain exposed in correspondence of the protrusion P420. That is, the frame ring 400 may directly face the frame ring 1300 in correspondence of the protrusion P420. Other aspects of the semiconductor device SD32 may be the same as previously described for the semiconductor device SD10 (illustrated, e.g., in FIG. 3A).

Figure 14:
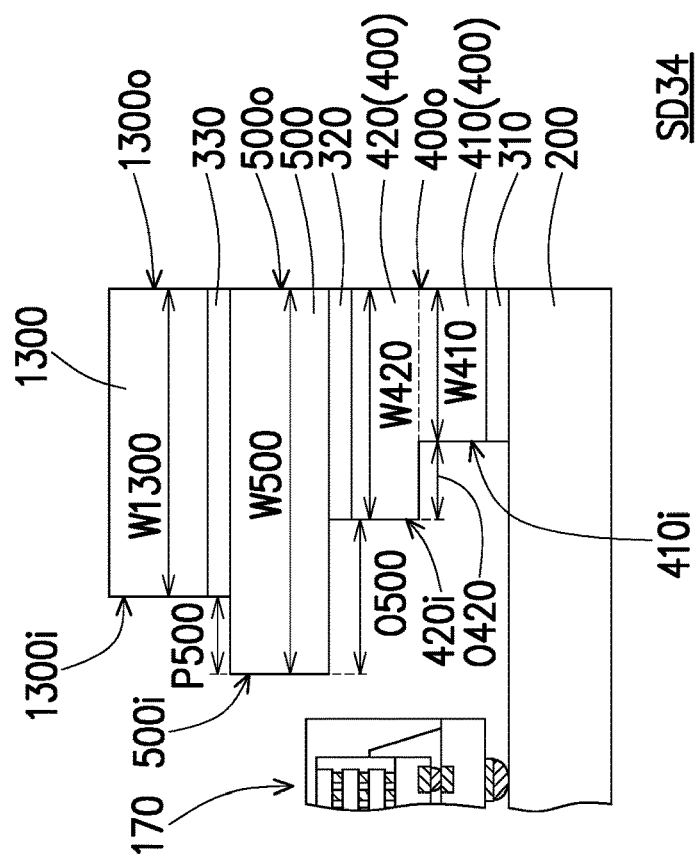

FIG. 14 is a schematic cross-sectional view of a region of a semiconductor device SD34 according to some embodiments of the disclosure. In some embodiments, the semiconductor device SD34 may have a similar structure and be manufactured according to a similar process to the semiconductor device SD30 of FIG. 12. In some embodiments, the view of FIG. 14 is taken along a region corresponding to the region of the semiconductor device SD30 illustrated in FIG. 12, but the disclosure is not limited thereto, and the configuration illustrated in FIG. 13 may be encountered along different regions of the semiconductor device SD34. In some embodiments, in the semiconductor device SD34, the width W500 of the frame ring 500 is greater than the width W420 of the overhang portion 420 of the frame ring 400 and is also greater than the width W1300 of the frame ring 1300. For example, the outer edge 500o of the frame ring 500 may still be vertically aligned with the outer edges 400o of the frame ring 400 and 1300o of the frame ring 1300, while the inner edge 500i of the frame ring 500 may protrude with respect to both of the inner edge 420i of the overhang portion 420 and the inner edge 1300i of the frame ring 1300. That is, in the semiconductor device SD34, the frame ring 500 may have the overhang O500 with respect to the overhang portion 420 and the protrusion P500 with respect to the frame ring 1300, while the overhang portion 420 may have the overhang O420 with respect to the base portion 410. In some embodiments, the adhesive 330 may be disposed between the frame ring 500 and the frame ring 1300, so that the frame ring 500 may remain exposed in correspondence of the protrusion P500. Other aspects of the semiconductor device SD34 may be the same as previously described for the semiconductor device SD10 (illustrated, e.g., in FIG. 3A).

Figure 15:
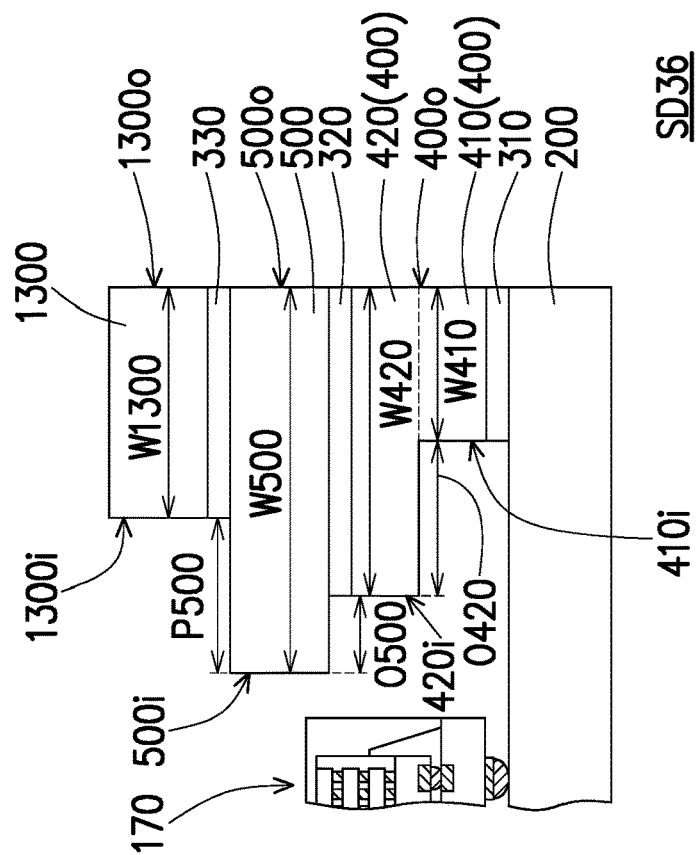

While in the semiconductor device SD34 of FIG. 14 the width W1300 of the frame ring 1300 is still greater than the width W420 of the overhang portion 420, the disclosure is not limited thereto. For example, in the semiconductor device SD36 of FIG. 15, the width W1300 of the frame ring 1300 is smaller than the width W420 of the overhang portion 420, so that the inner edge 420i protrudes further towards the semiconductor package 170 with respect to the inner edge 1300i of the frame ring 1300. In some embodiments, the width W1300 may be intermediate between the width W420 of the overhang portion 420 and the width W410 of the base portion of the frame ring 400. Other aspects of the semiconductor device SD36 may be the same as previously described for the semiconductor device SD34 of FIG. 14.

Figure 16:
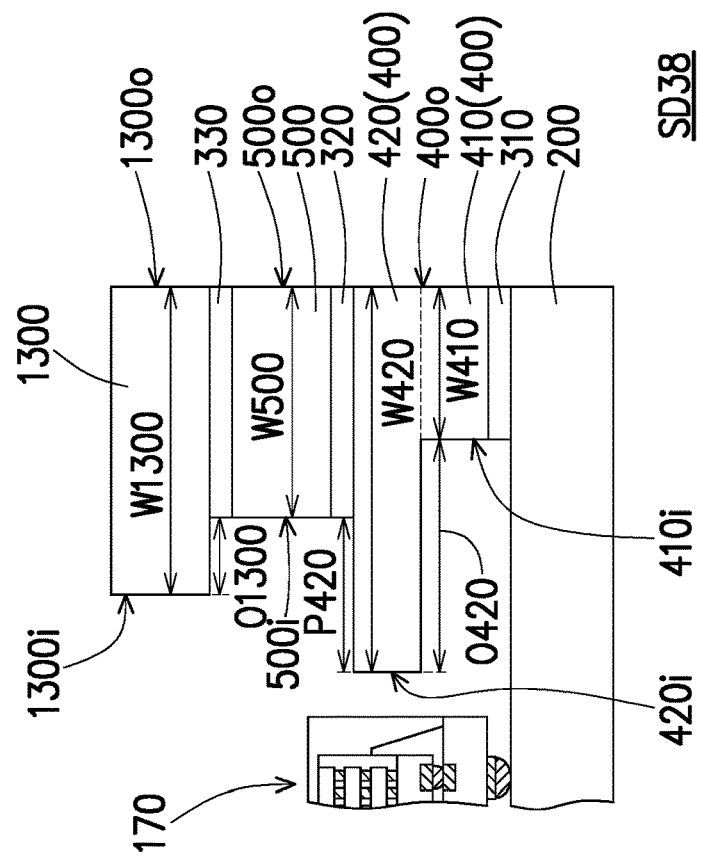

FIG. 16 is a schematic cross-sectional view of a region of a semiconductor device SD38 according to some embodiments of the disclosure. In some embodiments, the semiconductor device SD38 may have a similar structure and be manufactured according to a similar process to the semiconductor device SD30 of FIG. 12. In some embodiments, the view of FIG. 16 is taken along a region corresponding to the region of the semiconductor device SD30 illustrated in FIG. 12, but the disclosure is not limited thereto, and the configuration illustrated in FIG. 16 may be encountered along different regions of the semiconductor device SD38. In some embodiments, in the semiconductor device SD38, the width W420 of the overhang portion 420 is greater than the width W500 of the frame ring 500 and is also greater than the width W1300 of the frame ring 1300. Furthermore, the width W1300 of the frame ring 1300 is greater than the width W500 of the frame ring 500. For example, the outer edge 500o of the frame ring 500 may still be vertically aligned with the outer edges 400o of the frame ring 400 and 1300o of the frame ring 1300, while the inner edge 420i of the overhang portion 420 may protrude with respect to both of the inner edge 500i of the frame ring 500 and the inner edge 410i of the base portion 410. The inner edge 1300i of the frame ring 1300 may protrude with respect to the inner edges 500i and 410i of the other frame rings 400 and 500. That is, in the semiconductor device SD38, the frame ring 1300 may have the overhang O1300 with respect to the frame ring 500, and the overhang portion 420 may have the overhang O420 with respect to the base portion 410 and the protrusion P420 with respect to the frame ring 500. In some embodiments, the adhesive 320 may be disposed between the frame ring 400 and the frame ring 500, so that the frame ring 400 may remain exposed in correspondence of the protrusion P420. As such, the overhang portion 420 may directly face the frame ring 1300 in correspondence of the protrusion P420. Other aspects of the semiconductor device SD38 may be the same as previously described for the semiconductor device SD10 (illustrated, e.g., in FIG. 3A).

Figure 17:
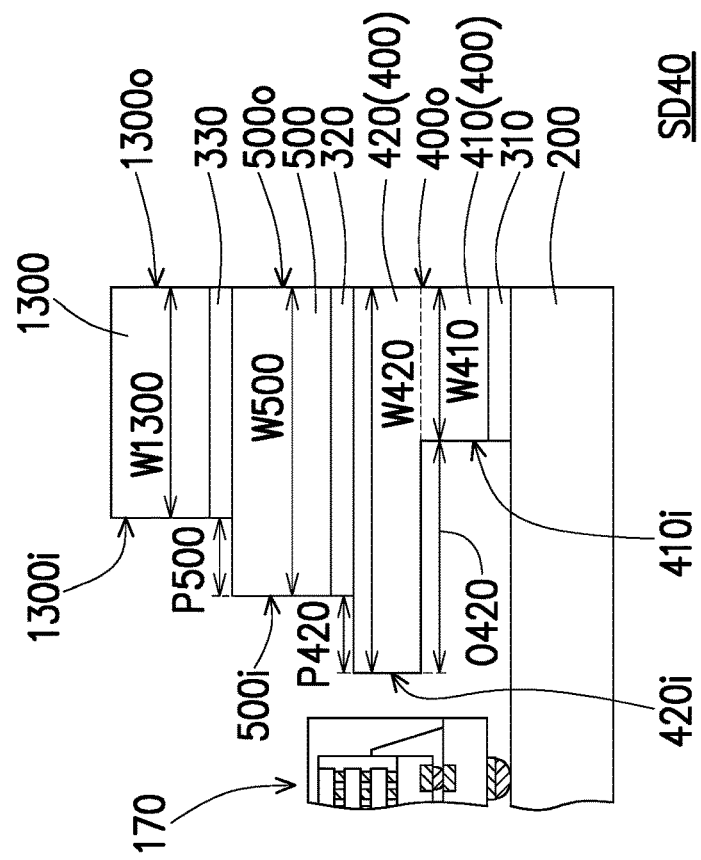

While in the semiconductor device SD38 of FIG. 16 the width W1300 of the frame ring 1300 is still greater than the width W500 of the frame ring 500, the disclosure is not limited thereto. For example, in the semiconductor device SD40 of FIG. 17, the width W1300 of the frame ring 1300 is smaller than the width W500 of the frame ring 500, so that the inner edge 500i protrudes further towards the semiconductor package 170 with respect to the inner edge 1300i of the frame ring 1300. That is, the overhang portion 420 may have the protrusion P420 with respect to the frame ring 500, and the frame ring 500 may have the protrusion P500 with respect to the frame ring 1300. In some embodiments, the width W1300 may be intermediate between the width W500 of the frame ring 500 and the width W410 of the base portion of the frame ring 400. Other aspects of the semiconductor device SD40 may be the same as previously described for the semiconductor device SD38 of FIG. 16.

It should be noted that while in the above embodiments the outer edges 1300o, 500o, and 400o of the frame rings 1300, 500, and 400, were shown as vertically aligned, the disclosure is not limited thereto. For example, in some embodiments, configurations such as the ones of FIG. 6A or FIG. 6B with the frame rings 500 and/or 400 protruding at one or both sides of the overlying frame ring(s) 1300 and/or 500 are possible, and contemplated within the scope of the disclosure. Furthermore, while the embodiments of FIG. 12 to FIG. 17 have been illustrated as including the frame ring 400, the disclosure is not limited thereto, and other frame rings (such as the frame rings 800, 900, 1000, or 1100 illustrated in FIG. 7A to FIG. 10H) may be used in place of the frame ring 400.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor device includes a circuit substrate, at least one semiconductor die, a first frame, and a second frame.

The at least one semiconductor die is connected to the circuit substrate. The first frame is disposed on the circuit substrate and encircles the at least one semiconductor die. The second frame is stacked on the first frame. The first frame includes a base portion and an overhang portion. The base portion has a first width. The overhang portion is disposed on the base portion and has a second width greater than the first width. The overhang portion laterally protrudes towards the at least one semiconductor die with respect to the base portion. The first width and the second width are measured in a protruding direction of the overhang portion.

In accordance with some embodiments of the disclosure, a semiconductor device includes a circuit substrate, a semiconductor package, a first metallic ring and a second metallic ring. The semiconductor package is connected to the circuit substrate. The first metallic ring is disposed on the circuit substrate and laterally surrounds the semiconductor package. The second metallic ring is disposed on the first metallic ring. The first metallic ring has a first edge, a second edge, and a third edge. The first edge is vertically aligned with an outer edge of the circuit substrate. The second edge and the third edge are opposite to the first edge. The second edge is closer to the circuit substrate than the third edge. A first distance from the second edge to the first edge is smaller than a second distance from the third edge to the first edge. The first distance and the second distance are measured along a same direction perpendicular to the outer edge of the circuit substrate.

In accordance with some embodiments of the disclosure, a manufacturing method of a semiconductor device includes the following steps. A semiconductor package is connected to a circuit substrate. A first frame ring is bonded to the circuit substrate. The first frame ring encircles the semiconductor package and has at least one overhang over the circuit substrate. A second frame ring is bonded to the first frame ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit substrate;
   at least one semiconductor die, connected to the circuit substrate;
   a first frame disposed on the circuit substrate and encircling the at least one semiconductor die; and
   a second frame stacked on the first frame,
   wherein the first frame comprises a base portion and an overhang portion laterally protrudes towards the at least one semiconductor die with respect to the base portion, and
   wherein the second frame laterally protrudes towards the at least one semiconductor die with respect to the overhang portion of the first frame.

2. The semiconductor device of claim 1, wherein a sidewall of the first frame is flushed with a sidewall of the circuit substrate.

3. The semiconductor device of claim 1, wherein a sidewall of the first frame is flushed with a sidewall of the second frame.

4. The semiconductor device of claim 1, further comprising a third frame disposed on the second frame, wherein a sidewall of the third frame is flushed with a sidewall of the second frame.

5. The semiconductor device of claim 1, wherein the first frame comprises a first material different than a second material comprised in the second frame, a coefficient of thermal expansion of the first material is smaller than a coefficient of thermal expansion of the second material, and a third material comprised in the circuit substrate has a coefficient of thermal expansion intermediate between the first material and the second material.

6. The semiconductor device of claim 1, further comprising a surface mount device connected on the circuit substrate and disposed between the overhang portion of the first frame and the circuit substrate.

7. The semiconductor device of claim 1, further comprising a first adhesive adhering the first frame to the circuit substrate, and a second adhesive adhering the second frame to the first frame.

8. A semiconductor device, comprising:
   a circuit substrate;
   a semiconductor package connected to the circuit substrate;
   a first metallic ring disposed on the circuit substrate and laterally surrounding the semiconductor package; and
   a second metallic ring disposed on the first metallic ring,
   wherein an outer sidewall of the first metallic ring is aligned with an outer sidewall of the second metallic ring, and an inner sidewall of the first metallic ring is misaligned with an inner sidewall of the second metallic ring.

9. The semiconductor device of claim 8, wherein the first metallic ring comprises a base portion and an overhang portion laterally protrudes towards the semiconductor package with respect to the base portion.

10. The semiconductor device of claim 9, wherein the overhang portion of the first metallic ring protrudes from the inner sidewall of the second metallic ring.

11. The semiconductor device of claim 9, wherein the inner sidewall of the second metallic ring protrudes from the overhang portion of the first metallic ring.

12. The semiconductor device of claim 8, further comprising a third metallic ring disposed on the second metallic ring, wherein the second metallic ring protrudes from the third metallic ring.

13. The semiconductor device of claim 12, wherein an outer sidewall of the third metallic ring is flushed with the outer sidewall of the second metallic ring.

14. The manufacturing method of claim 8, further comprising a third metallic ring disposed on the second metallic ring, wherein the third metallic ring protrudes from the inner sidewall of the second metallic ring.

15. A manufacturing method of a semiconductor device, comprising:
   placing semiconductor dies side by side on a circuit substrate; and
   bonding an assembled frame ring to the circuit substrate, wherein the assembled frame ring encircles the semiconductor dies, and the assembled frame ring has a stepped sidewall towards the semiconductor dies.

16. The manufacturing method of claim 15, wherein bonding the assembled frame ring to the circuit substrate comprises:

bonding a first frame ring to the circuit substrate, wherein the first frame ring encircles the semiconductor package; and bonding a second frame ring to the first frame ring.

17. The manufacturing method of claim 16, wherein the first frame ring comprises a base portion and an overhang portion laterally protrudes towards the semiconductor dies with respect to the base portion, and the second frame ring laterally protrudes towards the semiconductor dies with respect to the overhang portion of the first frame ring.

18. The manufacturing method of claim 16, further comprising, connecting a surface mount device to the circuit substrate before bonding the first frame ring, wherein the first frame ring is bonded to the circuit substrate so that the surface mount device is disposed below the at least one overhang of the first frame ring.

19. The manufacturing method of claim 16, further comprising bonding a third frame ring to the second frame ring, wherein the second frame ring has at least one protrusion with respect to the third frame ring.

20. The manufacturing method of claim 16, further comprising bonding a third frame ring to the second frame ring, wherein the third frame ring has at least one overhang towards the semiconductor dies with respect to the second frame ring.

* * * * *